United States Patent [19]

Yamagishi

[11] Patent Number: 4,683,571
[45] Date of Patent: Jul. 28, 1987

[54] DIGITAL SIGNAL DECODING SYSTEM

[75] Inventor: Tooru Yamagishi, Tokyo, Japan

[73] Assignee: Victor Company of Japan, Ltd., Yokohama, Japan

[21] Appl. No.: 739,016

[22] Filed: May 29, 1985

[30] Foreign Application Priority Data

May 30, 1984 [JP] Japan .................... 59-110238
Jun. 18, 1984 [JP] Japan .................... 59-124810

[51] Int. Cl.$^4$ ............................................. G06F 11/10
[52] U.S. Cl. ........................................ 371/37; 371/40; 371/39
[58] Field of Search ................. 371/37, 38, 39, 40, 371/41, 42, 43, 44, 45; 375/118; 360/51

[56] References Cited

U.S. PATENT DOCUMENTS

| | | | |
|---|---|---|---|
| 4,291,406 | 9/1981 | Ball ................................ | 371/45 |
| 4,295,218 | 10/1981 | Tanner ........................... | 371/45 |
| 4,509,172 | 3/1985 | Chen .............................. | 371/38 |
| 4,520,408 | 5/1985 | Velasguez ...................... | 375/118 |

FOREIGN PATENT DOCUMENTS

A2079993 of 0000 United Kingdom.
1561556 of 0000 United Kingdom.
1274630 of 0000 United Kingdom.

OTHER PUBLICATIONS

"Error Recovery Scheme for the IBM 3850 Mass Storage System", by Patel, IBM J. Res. Develop., vol. 24, No. 1, (1980), pp. 32–42.
"Fehlerkorrigierende Block—Codierung fur die Datenubertragung", by Furrer, Basel, (1981), pp. 218–229.

Primary Examiner—Michael R. Fleming
Attorney, Agent, or Firm—Michael N. Meller

[57] ABSTRACT

A digital signal decoding system comprises a terminal for receiving a digital signal through a transmission path, which digital signal is encoded so that an error in one bit can be corrected in each of code words which are constituted by adding check bits to information bits and is modulated according to a self clock modulation system, a circuit for obtaining a demodulated signal by demodulating the digital signal, a first circuit for generating an encoded data and a clock signal from the demodulated signal, a circuit for generating an error possibility data from an output of the first circuit, which error possibility data assumes a first logic value at a bit position corresponding to a bit of the encoded data whereat an error does not exist and assumes a second logic value at a bit position corresponding to a bit of the encoded data whereat the possibility that an error exists is high, a memory circuit for pre-storing a first table containing the priority of a decoding sequence, and a circuit for obtaining the priority of the decoding sequence by referring to the first table based on the encoded data and the error possibility data and for obtaining a decoded data of an original data by correcting error in one or a plurality of bits of the encoded data and/or the error possibility data based on the priority.

13 Claims, 88 Drawing Figures

FIG.2A

| INFORMATION BITS | | | | CHECK BITS | | | | PATTERN NUMBER |
|---|---|---|---|---|---|---|---|---|
| | | | | HAMMING CORRECTION | | | ODD PARITY | |
| B7 | B6 | B5 | B4 | B3 | B2 | B1 | B0 | |
| 0 | 0 | 0 | 0 | 1 | 1 | 1 | 0 | 0 |
| 0 | 0 | 0 | 1 | 0 | 0 | 1 | 1 | 1 |
| 0 | 0 | 1 | 0 | 0 | 1 | 0 | 1 | 2 |
| 0 | 0 | 1 | 1 | 1 | 0 | 0 | 0 | 3 |
| 0 | 1 | 0 | 0 | 1 | 0 | 0 | 1 | 4 |
| 0 | 1 | 0 | 1 | 0 | 1 | 0 | 0 | 5 |
| 0 | 1 | 1 | 0 | 0 | 0 | 1 | 0 | 6 |
| 0 | 1 | 1 | 1 | 1 | 1 | 1 | 1 | 7 |
| 1 | 0 | 0 | 0 | 0 | 0 | 0 | 0 | 8 |
| 1 | 0 | 0 | 1 | 1 | 1 | 0 | 1 | 9 |
| 1 | 0 | 1 | 0 | 1 | 0 | 1 | 1 | A |
| 1 | 0 | 1 | 1 | 0 | 1 | 1 | 0 | B |
| 1 | 1 | 0 | 0 | 0 | 1 | 1 | 1 | C |
| 1 | 1 | 0 | 1 | 1 | 0 | 1 | 0 | D |
| 1 | 1 | 1 | 0 | 1 | 1 | 0 | 0 | E |
| 1 | 1 | 1 | 1 | 0 | 0 | 0 | 1 | F |

FIG.2B

| | HEXADECIMAL INDICATION OF UPPER FOUR BITS | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | A | B | C | D | E | F |
| 0 | 8 | * | * | 3 | * | 5 | 6 | * | 8 | 8 | 8 | * | 8 | * | * | F |
| 1 | * | 1 | 2 | * | 4 | * | * | F | 8 | * | * | F | * | F | F | F |
| 2 | * | 1 | 6 | * | 6 | * | 6 | 6 | 8 | * | * | B | * | D | 6 | * |
| 3 | 1 | 1 | * | 1 | * | 1 | 6 | * | * | 1 | A | * | C | * | * | F |
| 4 | * | 5 | 2 | * | 5 | 5 | * | 5 | 8 | * | * | B | * | 5 | E | * |
| 5 | 2 | * | 2 | 2 | * | 5 | 2 | * | * | 9 | 2 | * | C | * | * | F |
| 6 | 0 | * | * | B | * | 5 | 6 | * | * | B | B | B | C | * | * | B |
| 7 | * | 1 | 2 | * | C | * | * | 7 | C | * | * | B | C | C | C | * |
| 8 | * | 3 | 3 | 3 | 4 | * | * | 3 | 8 | * | * | 3 | * | D | E | * |
| 9 | 4 | * | * | 3 | 4 | 4 | 4 | * | * | 9 | A | * | 4 | * | * | F |
| A | 0 | * | * | 3 | * | D | 6 | * | * | D | A | * | D | D | * | D |
| B | * | 1 | A | * | 4 | * | * | 7 | A | * | A | A | * | D | A | * |
| C | 0 | * | * | 3 | * | 5 | E | * | * | 9 | E | * | E | * | E | E |
| D | * | 9 | 2 | * | 4 | * | * | 7 | 9 | 9 | * | 9 | * | 9 | E | * |
| E | 0 | 0 | 0 | * | 0 | * | * | 7 | 0 | * | * | E | * | D | E | * |
| F | 0 | * | * | 7 | * | 7 | 7 | 7 | * | 9 | A | * | C | * | * | 7 |

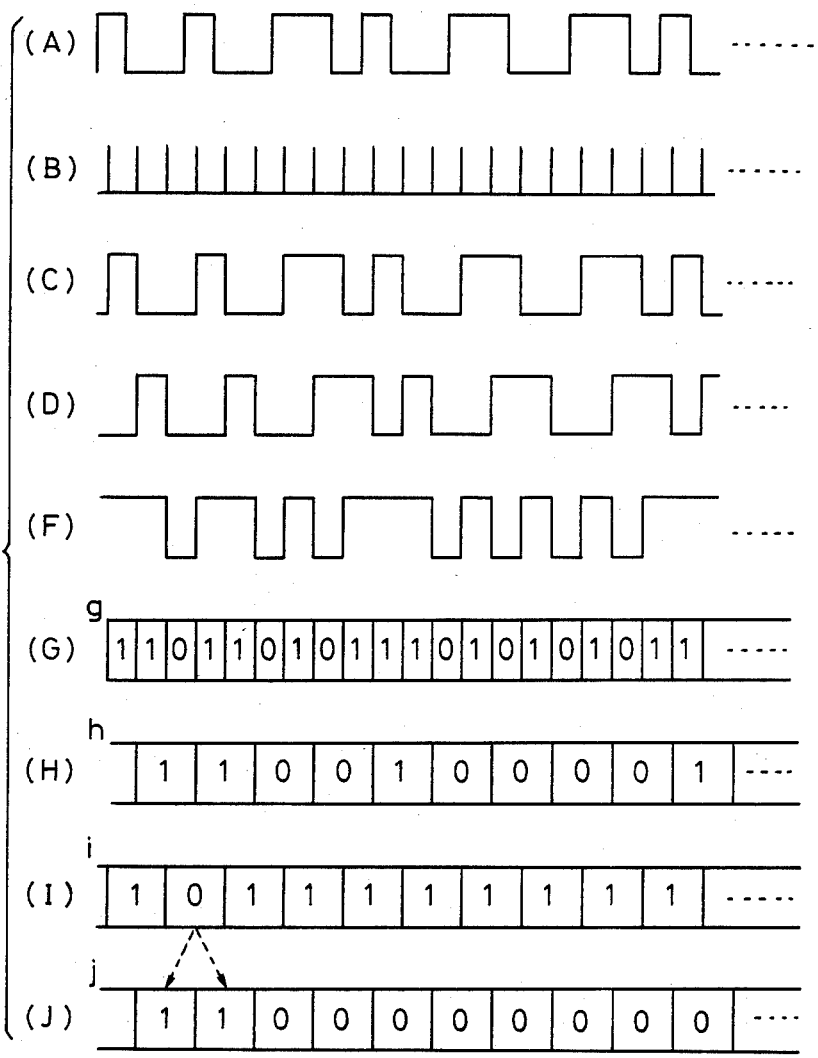

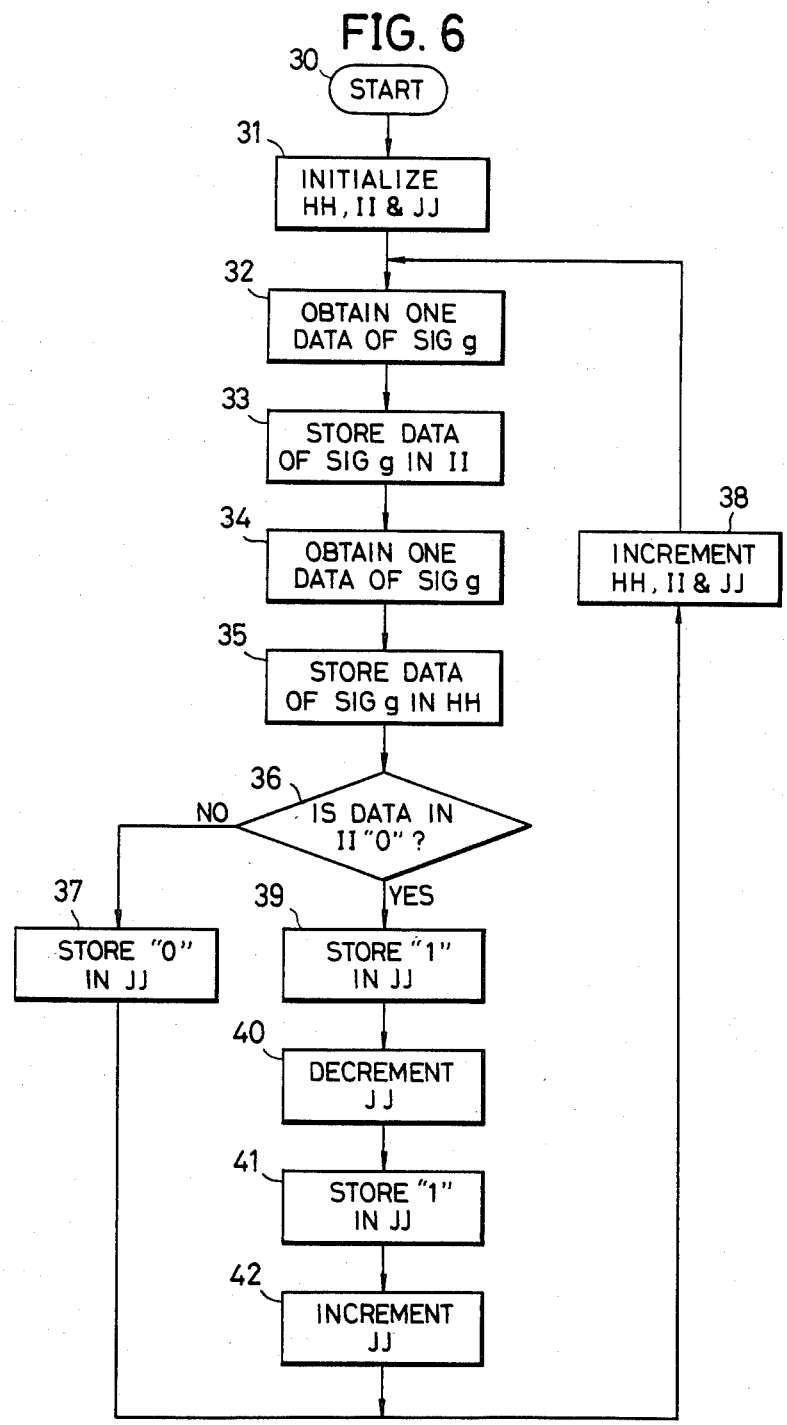

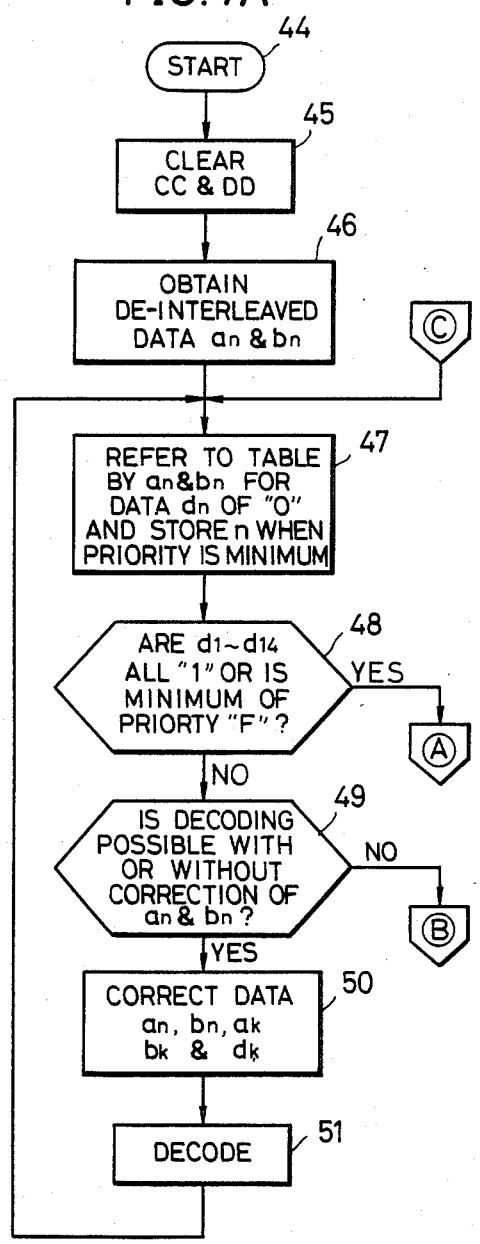
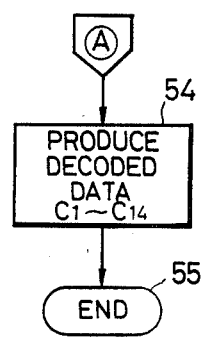
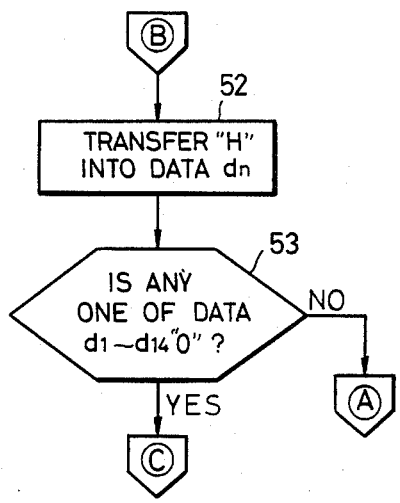
FIG. 7A
FIG. 7B
FIG. 7C

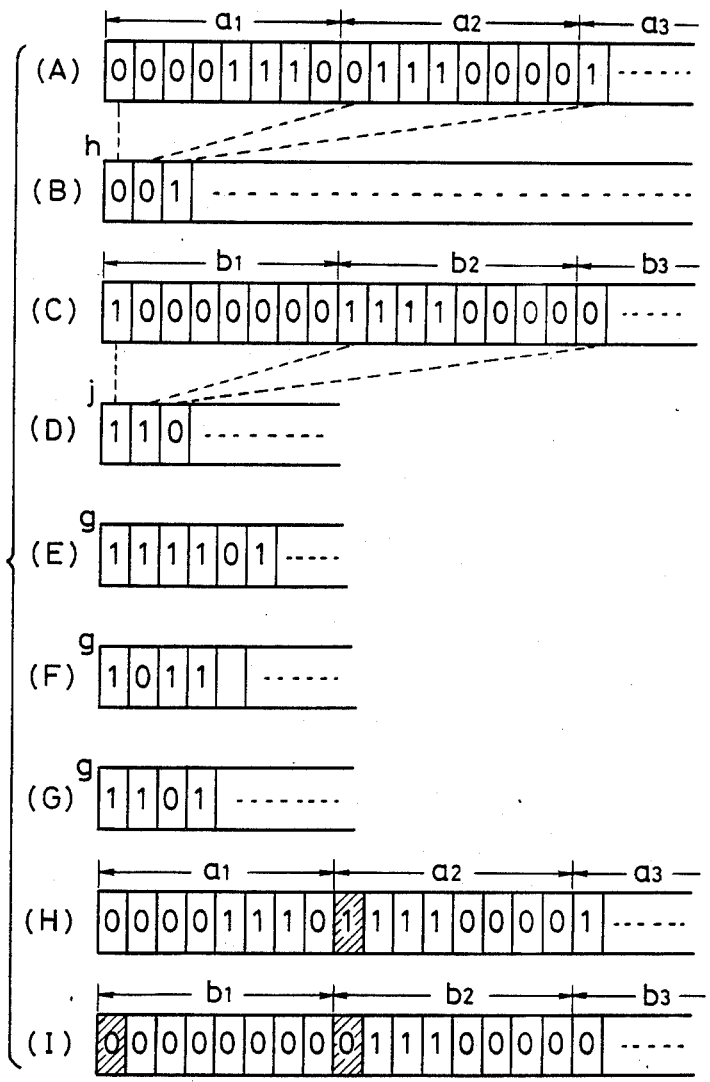

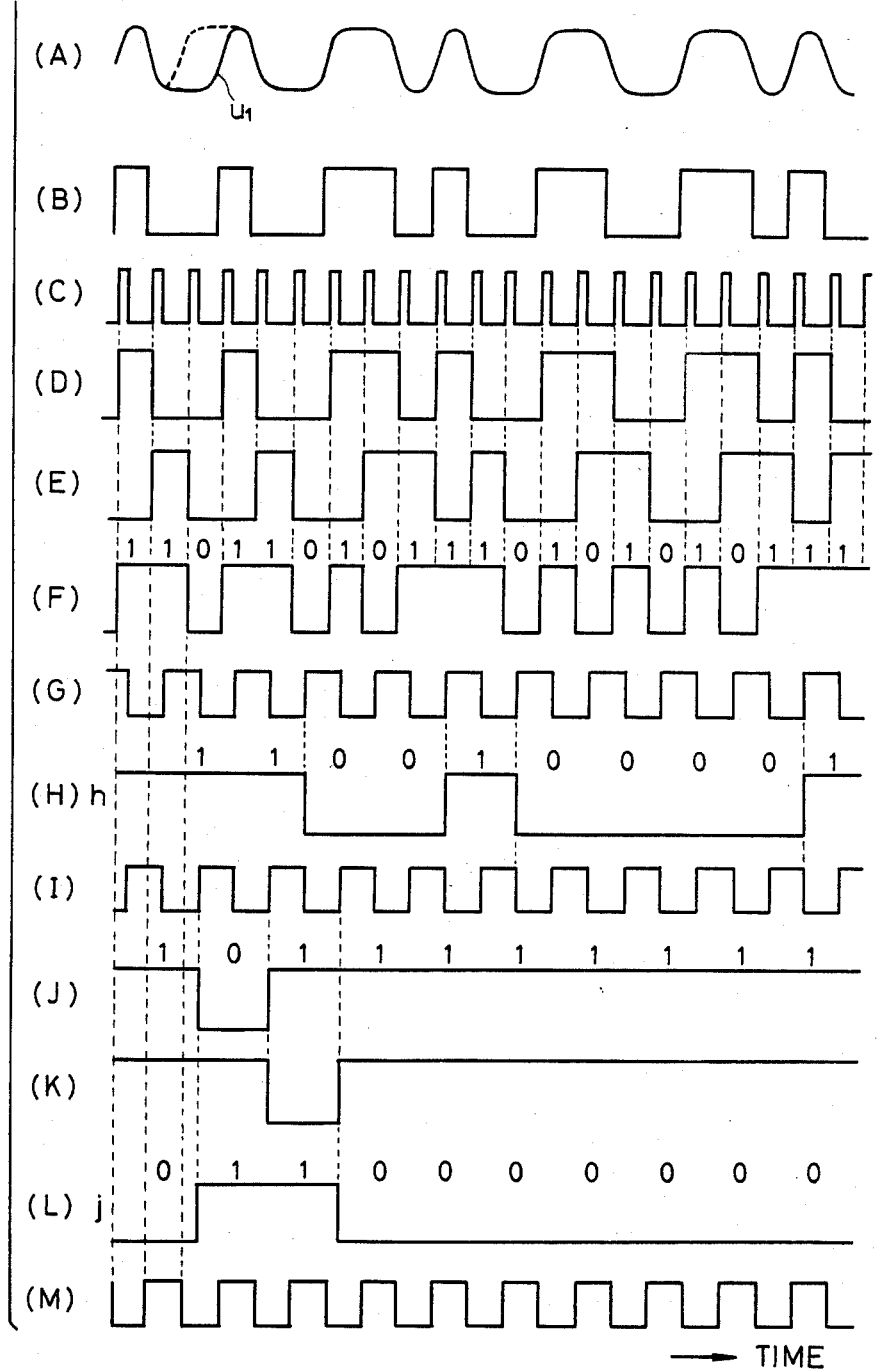

FIG. 12

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 98 | CE | CE | 93 | CE | 95 | 96 | CE | 08 | A8 | A8 | CE | A8 | CE | CE | 9F |
| 1 | CE | 91 | 92 | CE | 94 | CE | CE | 9F | A8 | CE | CE | 9F | CE | 9F | 9F | 0F |
| 2 | CE | 91 | 96 | CE | 96 | CE | 06 | A6 | A8 | CE | CE | 9B | CE | 9D | A6 | CE |
| 3 | 91 | 01 | CE | A1 | CE | A1 | A6 | CE | CE | A1 | 9A | CE | 9C | CE | CE | AF |
| 4 | CE | 95 | 92 | CE | 95 | 05 | CE | A5 | A8 | CE | CE | 9B | CE | A5 | 9E | CE |
| 5 | 92 | CE | 02 | A2 | CE | A5 | A2 | CE | CE | A1 | A2 | CE | 9C | CE | CE | AF |
| 6 | 90 | CE | CE | 9B | CE | A5 | A6 | CE | CE | 99 | 9B | CE | 9C | CE | CE | AB |
| 7 | CE | A1 | CE | CE | 9C | CE | CE | 97 | 9C | 9B | CE | 0B | 0C | AC | CE | CE |
| 8 | CE | A2 | A2 | CE | 9C | CE | CE | A3 | A8 | CE | CE | AB | CE | AC | AC | CE |
| 9 | 94 | 93 | 93 | 03 | 94 | A4 | A4 | CE | CE | 99 | 9A | A3 | CE | 9D | 9E | AD |
| A | 90 | CE | CE | A3 | 04 | A4 | A6 | CE | 9A | 9D | 9A | CE | A4 | CE | CE | CE |
| B | CE | A1 | 9A | CE | CE | 9D | CE | CE | CE | CE | 0A | AA | 9D | 0D | CE | AD |
| C | 90 | CE | CE | CE | CE | A5 | 9E | CE | CE | 99 | 9E | CE | CE | CE | AA | CE |
| D | CE | 99 | A2 | CE | A4 | CE | CE | 97 | 99 | 09 | CE | A9 | 9E | CE | 0E | AE |
| E | 00 | A0 | A0 | CE | A0 | CE | CE | 97 | A0 | CE | CE | AB | CE | A9 | AE | CE |
| F | A0 | CE | CE | 97 | CE | 97 | 97 | 07 | CE | A9 | AA | CE | AC | CE | CE | A7 |

← INFORMATION BITS

↓ HAMMING CODE PLUS PARITY BIT

DIGITAL SIGNAL DECODING SYSTEM

BACKGROUND OF THE INVENTION

The present invention generally relates to digital signal decoding systems, and more particularly to a digital signal decoding system which decodes a digital signal by correcting a plurality of erroneous bits in each code word of the digital signal, which digital signal is encoded so that it is possible to correct one erroneous bit in each code word.

Conventionally, there is a transmission system which adds check bits to information bits to constitute code words and transmits through a transmission path a digital signal which is obtained by modulating the code words according to a self clock modulation system such as the biphase mark modulation system and the biphase space modulation system. According to the conventional transmission system, a decoding apparatus in the signal reception side demodulates the digital signal which is received through the transmission path, and performs error detection and error correction in order to decode the correct information bits (original data). When this conventional transmission system transmits a digital signal which is encoded so that it is possible to correct one erroneous bit in each code word, the decoding apparatus corrects one erroneous bit in an arbitrary code word even when one erroneous bit exists in the arbitrary code word, and it is possible to decode the correct information bits. However, when two or more erroneous bits exist in one code word, there are problems in that in some cases the decoding apparatus cannot decode the information bits and in some cases the probability of the decoding apparatus performing an erroneous decoding is high.

SUMMARY OF THE INVENTION

Accordingly, it is a general object of the present invention to provide a novel and useful digital signal decoding system in which the problems described heretofore are eliminated.

Another and more specific object of the present invention is to provide a digital signal decoding system which is supplied through a transmission path with a digital signal which is obtained by adding check bits to information bits to constitute code words and modulating the code words according to a self clock modulation system, which digital signal decoding system detects and corrects errors to decode the correct information bits (original data) even when a plurality of erroneous bits exist in an arbitrary code word. The digital signal decoding system according to the present invention comprises error possibility data generating means for generating an error possibility data based on a clock signal out of an encoded data and the clock signal which constitute the digital signal which is received through the transmission path, which error possibility data indicates the bit position of the encoded data where the possibility of the an error existing thereat is high, memory means for pre-storing a table containing the priority of the decoding sequence, and processing means for referring to the table based on the encoded data and the error possibility data so as to obtain a decoded data of the original data by use of the table.

Still another object of the present invention is to provide a digital signal decoding system which comprises error possibility data generating means for generating an error possibility data based on a clock signal out of an encoded data and the clock signal which constitute the digital signal which is received through the transmission path, which error possibility data indicates the bit position of the encoded data where the possibility of an error existing thereat is high, first memory means for pre-storing a first table containing the priority of the decoding sequence, second memory for pre-storing a second table containing the hamming distance of the encoded data, and processing means for referring to the first table based on the encoded data and the error possibility data and for referring to the second table based on upper and lower bits of the encoded data so as to obtain a decoded data of the original data by use of the data obtained from the first and second tables.

Other objects and further features of the present invention will be apparent from the following detailed description when read in conjunction with the accompanying drawings.

BRIEF DESCRIPTION OF THE DRAWINGS

FIGS. 2A and 2B are diagrams for explaining the encoding and decoding of the data;

FIGS. 5(A) through 5(J) show signal waveforms at parts of the circuit shown in FIG. 4;

FIG. 6 is a flow chart for explaining an embodiment of an operation of a central processing unit within the circuit shown in FIG. 4 when generating an error possibility data;

FIGS. 7A, 7B, and 7C are flow charts for explaining a processing performed by the central processing unit within the circuit shown in FIG. 4;

FIGS. 8(A) through 8(I) are diagrams showing an embodiment of the constitution of data obtained by the processing of FIG. 7;

FIGS. 10(A) through 10(M) show signal waveforms at parts of the circuit shown in FIG. 9;

FIG. 12 shows contents of a second table pre-stored in a memory within the circuit shown in FIG. 9;

DETAILED DESCRIPTION

First, a description will be given with respect to the case where an erroneous bit in a code word of a digital signal which is reproduced from a recording medium is corrected.

A rotary recording medium (hereinafter simply referred to as a disc) recorded with a control program signal and a disc reproducing apparatus for playing the disc and transmitting a reproduced control program signal to an external device which is coupled to the disc reproducing apparatus, have been proposed previously. The control program signal for the external device such as a computer having a discriminating function is modulated according to a self clock modulation system such as the biphase mark modulation system and the biphase space modulation system, and is recorded on a spiral track on the disc in synchronism with a horizontal synchronizing signal in time-sequence with an audio signal and together with a video signal. The disc reproducing apparatus supplies to the external device the reproduced control program signal out of the signals reproduced from the disc.

Figure 1:
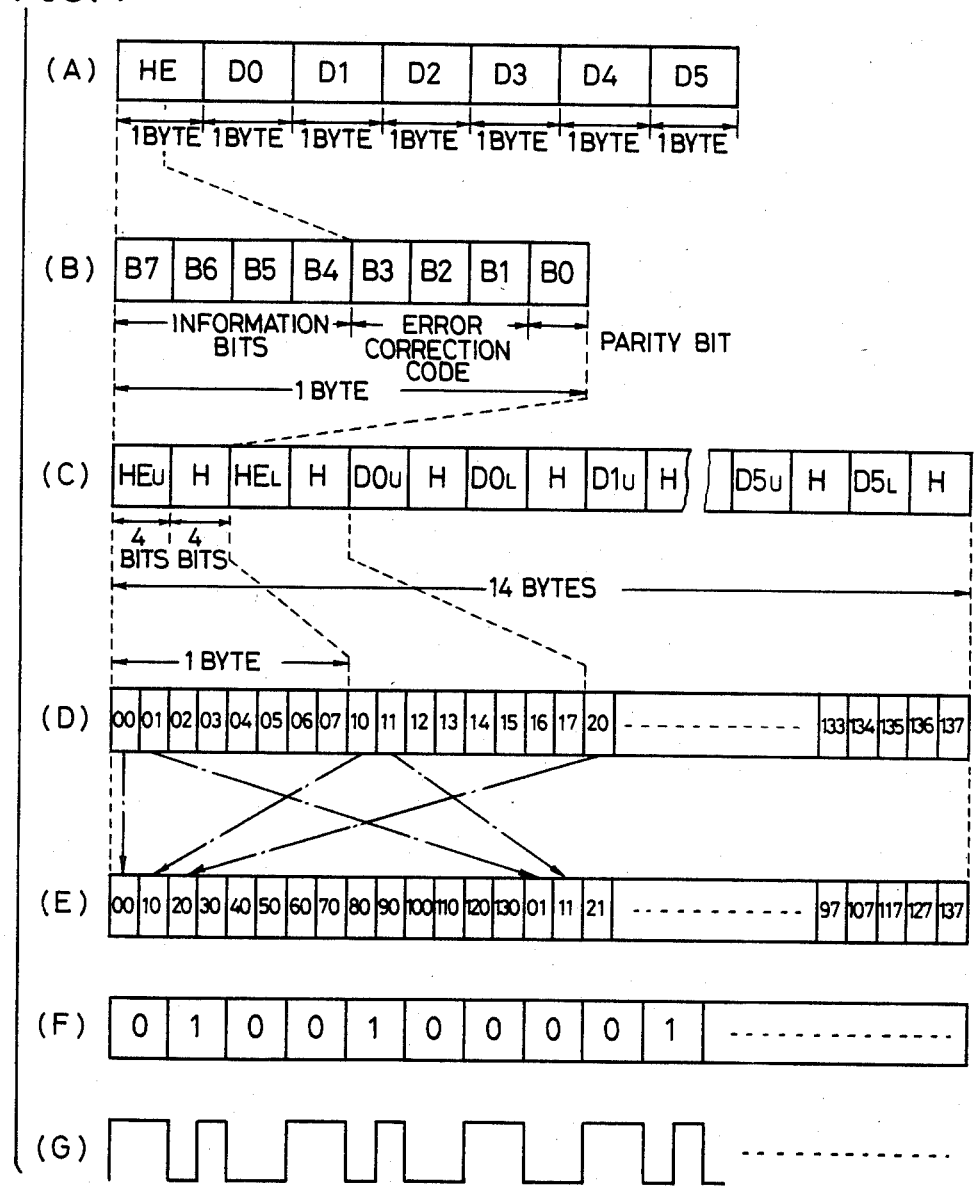
FIGS. 1(A) through 1(G) are diagrams for explaining the constitution of data recorded on a disc.
Figure 3:
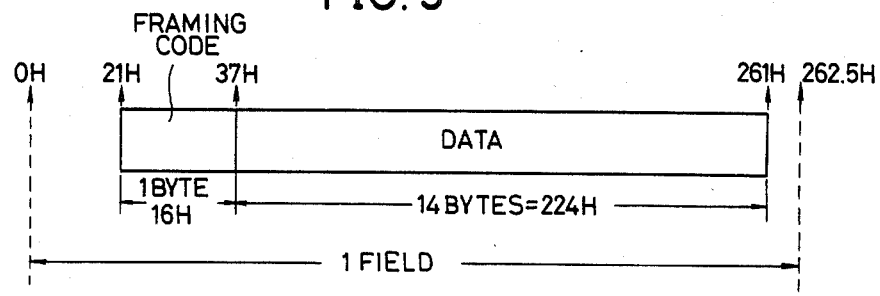
FIG. 3 is a diagram for explaining the constitution of data corresponding to one field.

Control programs and the like which are recorded on the disc are divided in terms of six bytes, for example. As shown in FIG. 1(A), a 1-byte header HE is added in front of six bytes of data D0 through D5. The seven bytes of data HE and D0 through D5 are each divided into upper four bits and lower four bits. Upper four information bits of the original data constitute the upper four bits of one byte, and a 3-bit error correction code and a 1-bit parity bit which constitute the lower four bits of the byte are added to the upper four bits. Similarly, lower four information bits of the original data constitute the upper four bits of another byte, and the 3-bit error correction code and the 1-bit parity bit which constitute the lower four bits of this other byte are added to the upper four bits of this other byte. FIG. 1(B) shows the constitution of the encoded data comprising information bits B7 through B4 of the upper (or lower) four bits of the original data, error correction bits B3 through B1 of the 3-bit error correction code, and a bit B0 of the 1-bit parity bit.

The values of the bits B7 through B0 shown in FIG. 1(B) are selected as shown in FIG. 2A by use of the following equations (1) through (4), where "+" represents a binary addition.

$$B7 + B5 + B4 + B3 = 1 \quad (1)$$
$$B7 + B6 + B4 + B2 = 1 \quad (2)$$
$$B7 + B6 + B5 + B1 = 1 \quad (3)$$
$$B7 + B6 + B5 + B4 + B3 + B2 + B1 + B0 = 1 \quad (4)$$

Each one byte of data having the constitution shown in FIG. 1(A) is added with the four check bits B3 through B0 as shown in FIG. 1(B) with respect to the upper and lower four bits of the original data. Hence, the data is transmitted in terms of fourteen bytes as shown in FIG. 1(C). In FIG. 1(C), the upper and lower four bits of the header signal HE shown in FIG. 1(A) are represented by $HE_U$ and $HE_L$, respectively. Similarly, a subscript "U" added to the original information data D0 through D5 represents the upper four bits thereof, and a subscript "L" added to the original information data D0 through D5 represents the lower four bits thereof. Further, "H" represents four check bits for detecting the error in the 4-bit information.

Next, the 14-byte data shown in FIG. 1(C) is interleaved in order to minimize the effects of burst error at the time of the reproduction. When the 14-byte data shown in FIG. 1(C) is sectioned for every one byte and numbered as shown in FIG. 1(D), the data are interleaved as shown in FIG. 1(E). Thereafter, a 1-byte framing code for indicating the beginning of the data is added in front of the 14-byte data. The fifteen bytes of data including the 1-byte framing code and the 14-byte data is transmitted so that one bit is transmitted in two horizontal scanning periods (2H, and H represents one horizontal scanning period). In the case where the recorded video signal is of the NTSC system, the 15-byte data is transmitted within a total of 240H from the scanning line number 21 to the scanning line number 160. The 15-byte data is modulated according to a self clock modulation system such as the biphase space modulation, for example, and a signal shown in FIG. 1(G) is recorded on the disc when the interleaved signal shown in FIG. 1(E) has the values shown in FIG. 1(F).

The 14-byte data which is obtained from the signal reproduced from the disc, is obtained in the sequence shown in FIG. 1(E). Hence, the signal shown in FIG. 1(E) is de-interleaved into the sequence shown in FIG. 1(D). The reproduced data shown in FIG. 1(D) is decoded for every one byte. The decoding is performed by referring to a table shown in FIG. 2B by an address which is described by the one byte of the data. In FIG. 2B, the abscissa describes the upper four bits of the 1-byte data in hexadecimal, and the ordinate describes the lower four bits of the 1-byte data in hexadecimal. A 4-bit data decoded by the upper and lower four bits of the 1-byte data (address) is also represented in hexadecimal. When a hexadecimal value "0" through "F" which is underlined is obtained as the 4-bit data decoded by the address, it is indicated that no error exists in the 1-byte reproduced data before the decoding. On the other hand, when a hexadecimal value "0" through "F" without the underline is obtained as the 4-bit data decoded by the address, it is indicated that an error of one bit exists in the 1-byte reproduced data before the decoding. On the other hand, a symbol "*" in FIG. 2B indicates that errors of two or more bits exist in the 1-byte reproduced data before the decoding and the reproduced data could not be decoded. The errors in the reproduced data occurs due to the transmission loss of the signal transmission system such as the recording and reproducing systems.

Accordingly, when decoding in the conventional digital signal decoding system a digital signal which is encoded so that an error of one bit in one code word can be corrected, there are problems in that the data cannot be decoded and the probability of an erroneous decoding being performed is high when errors of two or more bits exist in one code word.

Next, a description will be given with respect to a first embodiment of the digital signal decoding system according to the present invention by referring to FIG. 4. Among the signals reproduced from the disc described before, a modulated signal which is obtained by modulating data according to the biphase space modulation system is applied to an input terminal 11. The modulated signal is supplied to a comparator 12 and is shaped into a digital signal shown in FIG. 5(A). The output digital signal of the comparator 12 is supplied to a data input terminal of a D-type flip-flop 13. The flip-flop 13 is coupled in series with a D-type flip-flop 14. A reproduced horizontal synchronizing signal within the reproduced signal is applied to an input terminal 15 and is supplied to a counter 17. A reproduced vertical synchronizing signal within the reproduced signal is applied to an input terminal 16, and the counter 17 is reset by the vertical synchronizing signal. Hence, the counter 17 produces a signal from the scanning line number 21 (or the scanning line number 284) to set a S-R type flip-flop 18 and open the gate of an AND circuit 19. The flip-flop 18 is reset by the reproduced vertical synchronizing signal. Hence, the reproduced horizontal synchronizing signal shown in FIG. 5(B) is supplied to respective clock input terminals of the flip-flops 13 and 14 as a clock pulse, from the scanning line number 21 (or the scanning line number 284) until the reproduced vertical synchronizing signal is obtained. As a result, the flip-flop 13 produces a signal shown in FIG. 5(C) and supplies this signal to a data input terminal of the flip-flop 14. The flip-flop 14 delays the output signal of the flip-flop 13 by a delay time of 1H and produces a signal shown in FIG. 5(D). The output signals of the flip-flops 13 and 14 are respectively supplied to an exclusive-OR circuit 20. The exclusive-OR circuit 20 produces a signal shown in FIG. 5(F) and supplies this signal to a central processing unit (CPU) 21. The CPU 21 is also supplied with the reproduced horizontal synchronizing signal from the AND circuit 19.

The signal shown in FIG. 5(F) can be described in binary as shown in FIG. 5(G). The CPU 21 separates the signal g shown in FIG. 5(G) into a signal h (reproduced encoded data) shown in FIG. 5(H) and a signal i shown in FIG. 5(I). The signal h is obtained by extracting the signal g during the odd (or even) horizontal scanning periods, and the signal i is obtained by extracting the signal g during the even (or odd) horizontal scanning periods. The signal i is the clock component of the signal g at the time of the biphase space modulation, and all of the bits of the signal i should have the logic level "1" when no errors are generated during the transmission. The CPU 21 generates a signal j (error possibility data) shown in FIG. 5(J) from the signal i, in correspondence with the signal h. Each bit of the signal j corresponding to the bit of the signal i having the logic level "1", has the logic level "0". On the other hand, bits of the signal j adjacent to the bit of the signal i having the logic level "0", have the logic level "1". A bit of the signal j having the logic level "1" indicates that there is a possibility that an error exists in a corresponding bit of the signal h.

FIG. 6 is a flow chart for explaining the general operation of the CPU 21 when generating the signal j. First, the operation of the CPU 21 is started in a step 30, and a step 31 initializes pointers HH, II, and JJ within a memory circuit 22 for respectively storing the addresses where the data of the signals h, i, and j are to the stored. A step 32 obtains one data of the signal g, and a step 33 stores this data into the address of the pointer (hereinafter simply referred as the pointer address) II. A step 34 obtains the next data of the signal g, and a step 35 stores this next data at the pointer address HH. A step 36 discriminates whether the data stored at the pointer address II has the logic level "0" or not, and a step 37 stores a data "0" at the pointer address JJ when the discrimination results in the step 36 is NO. In this case, a step 38 increments the pointer addresses HH, II, and JJ, and the operation is returned to the step 32.

On the other hand, when the discrimination result in the step 36 is YES, a step 39 stores a data "1" at the pointer address JJ, and a step 40 decrements the pointer address JJ. A step 41 stores a data "1" at the decremented pointer address JJ, and a step 42 increments the pointer address JJ. The step 38 is performed next to the step 42 so as to increment the pointer addresses HH, II, and JJ, respectively, and the operation is returned to the step 32 as described before.

Therefore, the signal h is generated from the data stored at the pointer address HH, and the signal j is generated from the data stored at the pointer address JJ.

When the CPU 21 detects the 1-byte framing code from the signal h which is demodulated in the manner described before, the CPU 21 stores in the memory circuit 22 the signal h related to the fourteen bytes of data demodulated immediately following the framing code and the signal j corresponding to the demodulated data, in the sequence according to FIG. 1(E). The CPU 21 thereafter performs the processing which will now be described in conjunction with the flow charts shown in FIGS. 7A through 7C.

In addition to the pointers HH, II, and JJ, the memory circuit 22 is also provided with pointers AA and BB for respectively storing the addresses where the data of the signals obtained by de-interleaving the signals h and j are stored, a pointer CC for storing the addresses where 4-bit decoded data $c_1$ through $c_{14}$ are stored, a pointer DD for storing the addresses where state data $d_1$ through $d_{14}$ are stored, a pointer TT for storing the address where a table containing the priority of the decoding sequence is stored, and a point NN for storing the address where a variable n is stored. For example, the pointer CC points a memory part corresponding to seven bytes. The state data $d_1$ through $d_{14}$ indicate the decoded state.

In FIG. 7A, when the operation of the CPU 21 is started in a step 44, a step 45 clears the pointers CC and DD. A step 46 performs the following series of operations. The data of the signal h which is stored into the memory circuit 22 in the sequence according to FIG. 1(D) while successively incrementing the pointer address HH, is de-interleaved into the sequence according to FIG. 1(D) and is stored at the pointer address AA That is, the 1-byte reproduced encoded data $a_1$ through $a_{14}$ are successively stored at the pointer address AA. Similarly, the data of the signal j which is stored into the memory circuit 22 in the sequence according to FIG. 1(E) while successively incrementing the pointer address JJ, is de-interleaved into the sequence according to FIG. 1(D) and is stored at the pointer address BB. In other words, error possibility data $b_1$ through $b_{14}$ corresponding to the reproduced encoded data $a_1$ through $a_{14}$, are successively stored at the pointer address BB.

A step 47 makes reference to the table which is stored at the pointer address TT. The table contains the priority of the decoding sequence as will be described later, and is referred to by a 16-bit address. The upper eight bits of the 16-bit address are constituted by the reproduced encoded data $a_n$ and the lower eight bits are constituted by the error possibility data $b_n$, where the variable n is varied from one of fourteen.

A description will now be given with respect to an example of a method of making the table containing the priority of the decoding sequence based on the probability distribution of the generation of transmission loss. It will be assumed that the probability of a data having a pattern being transmitted is the same for each pattern, and the probability that a data having the logic level "0" is erroneously transmitted through the transmission path as a data having the logic level "1" and the probability that a data having the logic level "1" is erroneously transmitted through the transmission path as a data having the logic level "0", are respectively represented by p (p<<1). It will also be assumed that the probability that the error possibility data has the logic level "0" when an error exists in the data and the error possibility data should actually have the logic level "1" is represented by δ (δ<<1), and the probability that the error possibility data has the logic level "1" when no error exists in the data and the error possibility data should actually have the logic level "0" is represented by ε (ε<<1). In this case, when the data has the pattern "00000000" and the error possibility data has the pattern "10000000", the probability that the data actually has the pattern "10000000" is equal to $p \cdot (1-p)^7 \cdot (1-\delta) \cdot (1-\epsilon)^7$. The probability that the data actually has the pattern "01100010" is equal to $p^3 \cdot (1-p)^5 \cdot (1-\delta)^4 \cdot \delta^3 \cdot \epsilon$. Similarly, the probability that the data actually has a certain pattern can be calculated, and a table containing the high calculated probabilities is the table described before containing the priority of the decoding sequence.

For example, the table contains a priority "1" at a hexadecimal address "8000", that is, when no error exists in the data $a_n$ and there is no possibility of a transmission loss. In this case, the data $a_n$ constituting the upper eight bits of the address has the hexadecimal value "80" and the data $b_n$ constituting the lower eight bits of the address has the hexadecimal value "00". When no error exists in the data $a_n$ and there is a possibility that a transmission loss exists in one bit of the data $a_n$, the table contains a priority "2" at an address "8001". When no error exists in the data $a_n$ and there is a possibility that a transmission loss exists in two bits of the data $a_n$, the table contains a priority "3" at an address "8011". On the other hand, when an error of one bit exists in the data $a_n$ and there is a possibility that a transmission loss exists in a bit of the data $a_n$ and a bit of the data $b_n$ corresponding to this bit of the data $a_n$ has the value logic "1", the table contains a priority "4" at an address "8101". Further, when errors exist in four bits of the data $a_n$ and there is a possibility of a transmission loss in all of the bits of the data $a_n$, the table contains at an address "8FFF" a priority "F" indicating that the data cannot be decoded. The method of determining the priority of the decoding sequence differs according to the probability distribution of the generation of transmission loss in the transmission path. Hence, it may be possible that the table contains the priority "2" at the address "8101" and contains the priority "3" at the address "8001".

When the step 47 is performed for the first time, the data $a_1$ through $a_{14}$ are not yet decoded. Hence, the data $a_1$ and $b_1$ are first decoded, the data $a_2$ and $b_2$ are then decoded, and the data $a_n$ and $b_n$ are similarly decoded thereafter by varying the variable n from three to fourteen. The table is referred to by the address constituted by the data $a_n$ and $b_n$, and the minimum value of the priority and the value of the variable n for designating the data $a_n$ and $b_n$ for obtaining the minimum value are stored in the memory circuit 22.

A step 48 discriminates whether or not each of the state data $d_1$ through $d_{14}$ stored at the pointer address DD has the logic value "1" which indicates that the decoding has been performed, or whether or not the minimum value of the priority obtained in the step 47 is equal to "F". When the discrimination result in the step 48 is YES, the operation advances to an output process shown in FIG. 7B. The operation advances to a step 49 when the discrimination result in the step 48 is NO.

The step 49 obtains the data $a_n$ and $b_n$ depending on the value of the variable n stored in the step 47, and discriminates whether or not the data $a_n$ can be decoded. When the data $a_n$ can be decoded without correcting the data $a_n$ and $b_n$ (that is, when the priority is equal to "1") or when the data $a_n$ can be decoded by partially correcting the data $a_n$ and $b_n$, the discrimination result in the step 49 is YES and the operation advances to a step 50. On the other hand, when the data $a_n$ and $b_n$ cannot be corrected to such an extent that the data $a_n$ can be decoded, the discrimination result in the step 49 is NO and the operation advances to a deferment process shown in FIG. 7C.

The step 50 corrects the pointers AA, BB, HH, II, and JJ by use of the data $a_n$ and $b_n$ which are designated by the variable n. For example, when the variable n is equal to one and the data $a_1$ and $b_1$ are respectively equal to hexadecimal values "OE" and "80" as shown in FIGS. 8(A) and 8(C), the signals h and j are as shown in FIGS. 8(B) and 8(D), respectively, and the signal g is as shown in FIG. 8(E). The signal g which assumes the value "1" in binary during the first scanning line and assumes the value "0" in binary during the fifth scanning line, may have the form shown in FIG. 8(F) or FIG. 8(G), for example. When it is assumed that the probability that the data $a_1$ which has the hexadecimal value "OE" is the same as the previous data is high due to the mutual relationship between the data $a_1$ and the data $b_1$ and the probability distribution of the generation of transmission loss in the transmission path, it may be assumed that the value "0" of the bit B7 in the data $a_1$ is correct. Hence, between the signals shown in FIGS. 8(F) and 8(G), it may be assumed that the signal shown in FIG. 8(G) having the value "0" for the bit B7 in the data $a_1$ is the original information data before the transmission. Therefore, the signal g shown in FIG. 8(E) is corrected to the signal shown in FIG. 8(G), and bits of the data $a_1$, $a_2$, $b_1$, and $b_2$ indicated by hatchings in FIGS. 8(H) and 8(I) are corrected accordingly. In other words, data $a_k$ and $b_k$ which are adjacent to the data $a_n$ and the data $b_n$, respectively, where the variable $k=n+1$ or $k=n-1$, are also corrected together with the data $a_n$ and the data $b_n$. In the case described heretofore, the variable $k=n+1$.

When the data $a_n$ and $b_n$ are corrected, the state data $d_k$ is obtained based on the variable k. When the state data $d_k$ has a value "H" indicating deferment of the decoding, only the data $d_k$ is cleared to "0". This operation is performed because even when the state data $d_k$ has a value "H" indicating that the data $a_k$ and $b_k$ before the correction cannot be decoded, it may become possible to decode the data $a_k$ and $b_k$. As an example, the data $a_2$ cannot be decoded at the address "70" in FIG. 2B, however, the corrected data $a_2$ can be decoded at the address "F0" as a hexadecimal value "F".

When no correction needs to be made in the data $a_n$ and $b_n$ (that is, when the priority is "1"), the step 50 is simply passed and the operation advances to a step 51.

In the step 51, the 4-bit data is decoded by the data $a_n$ designated by the variable n, and the upper four bits of the data $a_n$ are stored at the pointer address CC as a decoded data $c_n$. Further, the state data $d_n$ is set to the value "1" indicating that the decoding has been performed.

When the step 47 is performed for the second time and onwards, the variable n is varied and the table is referred to by the data $a_n$ and $b_n$ only for the variable n according to which the state data $d_n$ has the value "0", that is, only for the data which is not yet decoded or is deferred of the decoding. The variable n with which the priority becomes a minimum is stored in the memory circuit 22.

When it is discriminated in the step 49 that the decoding cannot be performed even when the data $a_n$ and $b_n$ are corrected, the operation advances to a step 52 shown in FIG. 7C. The step 52 transfers into the state data $d_n$ which is designated by the variable n a value "H" indicating the deferment of the decoding. Further, a step 53 discriminates whether or not the state data $d_1$ through $d_{14}$ have the value "0". When there is a state data $d_n$ having the value "0" (that is, when the corresponding data $a_n$ is not yet decoded) and the discrimination result in the step 53 is YES, the operation advances to the step 47 in FIG. 7A. On the other hand, when the state data $d_1$ through $d_{14}$ have the value "1" (that is, when the data $a_n$ is already decoded) or the value "H" (that is, when the decoding of the data $a_n$ is deferred) and the discrimination result in the step 53 is NO, the operation advances to the output process shown in FIG. 7B.

By performing the steps 47 through 51 a plurality of times, the data $a_n$ and $b_n$ having the priority "1" are first decoded, and the decoded data $c_n$ is obtained. Thereafter, the data $a_n$ and $b_n$ having a priority greater than "1" are corrected and decoded, and further, correctable parts of the data $a_k$ and $b_k$ which can be corrected are corrected and the priority of the data $a_k$ and $b_k$ is reduced. For example, even the data $a_n$ and $b_n$ which are discriminated in the step 49 as not being decodeable can be corrected in the step 50 when correcting the data $a_k$ and $b_k$ which are adjacent to the data $a_n$ and $b_n$, and in this case the data $a_n$ and $b_n$ can be corrected and decoded when the steps 47 through 51 are performed the next time.

The output process shown in FIG. 7B is performed when none of the data $d_1$ through $d_{14}$ has the value "0" or when the minimum value of the priority obtained based on the data $a_n$ and $b_n$ is "F" meaning that the data $a_n$ cannot be decoded. A step 54 successively reads out each of the 4-bit decoded data $c_1$ through $c_{14}$ stored at the pointer address CC, and produces the decoded data $c_1$ through $c_{14}$ in parallel through output terminals 23a through 23d shown in FIG. 4.

Therefore, even when an error exists in two or more bits of the reproduced encoded data, the data having the errors in two or more bits thereof is corrected when correcting the data having an error in one bit thereof, and the number of erroneous bits is accordingly reduced. Hence, according to the present invention, it is also possible to decode the data having the errors in two or more bits thereof.

In the first embodiment described heretofore, the contents of the table containing the priority of the decoding sequence and the correction and decoding of the encoded data and the error possibility data, are determined by the probability distribution of the generation of transmission loss in the transmission path. However, it is difficult to actually obtain the probability distribution of the generation of transmission loss of a transmission path. In addition, in the case where the transmission path is a recording medium and the probability distribution of the generation of transmission loss changes with time, it is difficult to follow the change in the probability distribution and make necessary changes in the contents of the table containing the priority of the decoding sequence and make necessary changes in the data correcting and data decoding methods.

Figure 9:
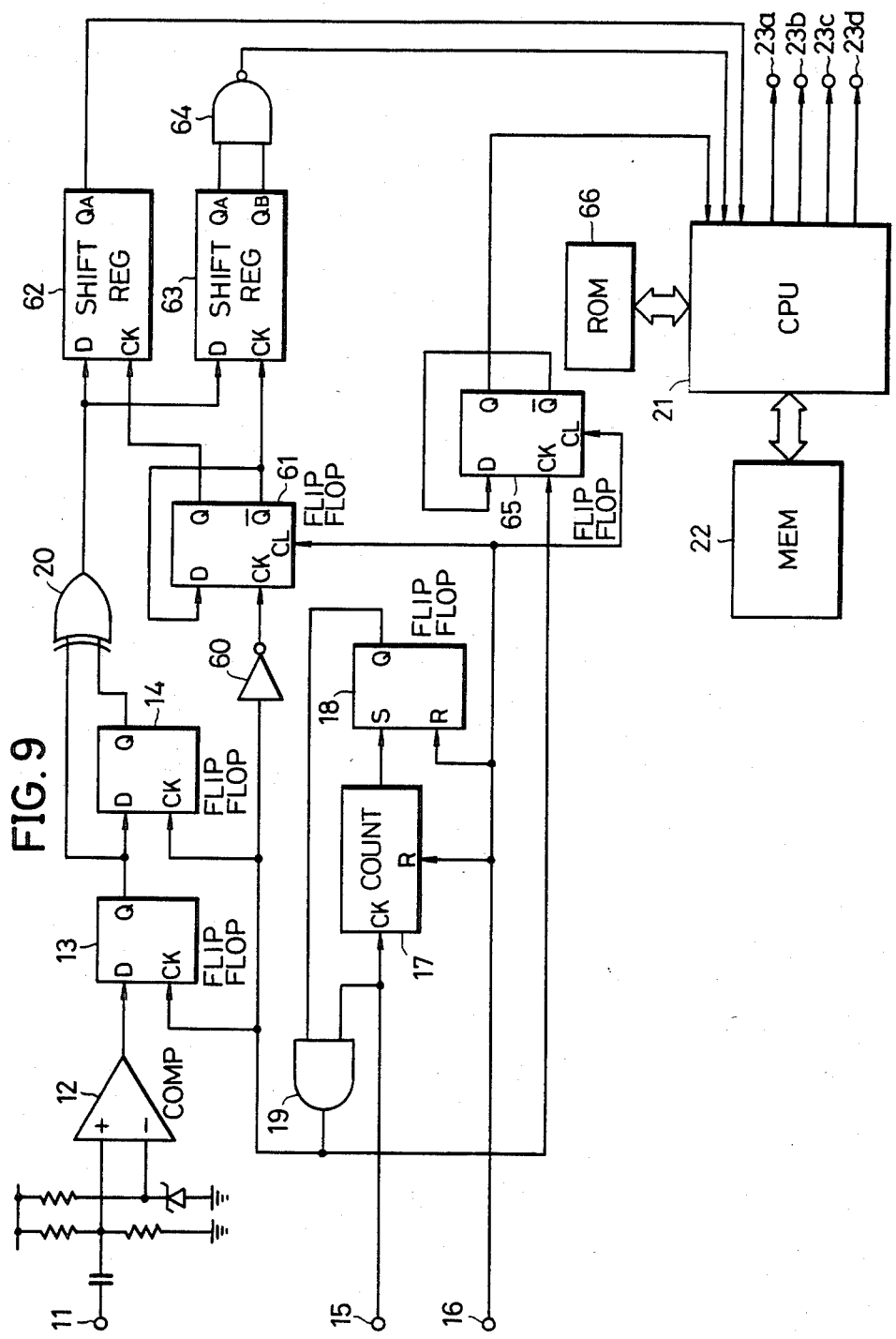
FIG. 9 is a circuit diagram showing a second embodiment of the digital signal decoding system according to the present invention.

Hence, a description will now be given with respect to a second embodiment of the digital signal decoding system according to the present invention in which the probability distribution of the generation of transmission loss in the transmission path is not used. FIG. 9 is a circuit diagram showing the second embodiment of the digital signal decoding system according to the present invention. In FIG. 9, those parts which are the same as those corresponding parts in FIG. 4 are designated by the same reference numerals and description thereof will be omitted. The output signal waveforms of the AND circuit 19, the flip-flop 13, the flip-flop 14, and the exclusive-OR circuit 20 are shown in FIGS. 10(B) through 10(F), respectively.

A reproduced signal which is reproduced from the disc, for example, is applied to the input terminal 11. The reproduced signal has a signal waveform shown in FIG. 10(A), for example. In FIG. 10(A), a signal part $u_1$ indicated by a solid line represents a part where the signal waveform is distorted due to a transmission error.

The output signal of the exclusive-OR circuit 20 is supplied to data input terminals of shift registers 62 and 63. The output signal of the AND circuit 19 is passed through an inverter 60 and is supplied to a clock input terminal of a D-type flip-flop 61. The reproduced vertical synchronizing signal from the input terminal 16 is supplied to a clear terminal of the flip-flop 61. A Q-output of the flip-flop 61 shown in FIG. 10(G) is supplied to a clock input terminal of the shift register 62. A $\overline{Q}$-output of the flip-flop 61 shown in FIG. 10(I) is supplied to a data input terminal thereof and to a clock input terminal of the shift register 63. As may be understood from FIGS. 10(G) and 10(I), the Q-output and $\overline{Q}$-output of the flip-flop 61 are square waves obtained by delaying the signal (reproduced horizontal synchronizing signal) shown in FIG. 10(C) by a time corresponding to the pulse width thereof, which square waves have a period of 2H and have mutually opposite phases.

The shift register 62 samples the output signal of the exclusive-OR circuit 20 shown in FIG. 10(F) by a rising edge of the Q-output of the flip-flop 61 shown in FIG. 10(G), and produces a signal h shown in FIG. 10(H) through an output terminal $Q_A$. The signal h is supplied to the CPU 21 as the encoded data. At the same time, the shift register 63 samples the output signal of the exclusive-OR circuit 20 by a rising edge of the $\overline{Q}$-output of the flip-flop 61 shown in FIG. 10(I), and produces a signal shown in FIG. 10(J) through an output terminal $Q_A$. The shift register 63 also produces through an output terminal $Q_B$ thereof a signal shown in FIG. 10(K) which is obtained by delaying the signal produced through the output terminal $Q_A$ of the shift register 63 by a time corresponding to one period of the Q-output of the flip-flop 61. The signals produced through the output terminals $Q_A$ and $Q_B$ of the shift register 63 are supplied to an AND circuit 64, and a signal j shown in FIG. 10(L) is obtained from the AND circuit 64. The signal j is supplied to the CPU 21 as the error possibility data.

In FIGS. 10(F), 10(H), 10(J), and 10(L), the numbers illustrated above the signal waveform indicate the data value of the signal.

The output signal of the AND circuit 19 shown in FIG. 10(C) is supplied to a clock input terminal of a D-type flip-flop 65. The reproduced vertical synchronizing signal from the input terminal 16 is supplied to a clear input terminal of the flip-flop 65. A $\overline{Q}$-output of the flip-flop 65 is supplied to a data input terminal thereof. Accordingly, the flip-flop 65 produces a Q-output shown in FIG. 10(M), and this Q-output is supplied to the CPU 21 as a latch pulse.

The signal h produced through the output terminal $Q_A$ of the shift register 62 is a Non Return to Zero (NRZ) signal (that is, interleaved encoded data) which is obtained by demodulating the output signal of the comparator 12. On the other hand, the signal produced through the output terminal $Q_A$ of the shift register 63 is a signal indicating the bit positions of the output signal of the comparator 12 whereat the possibility that an error exists is high. In other words, the output signal of the comparator 12 is a modulated signal obtained by a biphase mark modulation or a biphase space modulation, for example, and a transition always occurs at a starting point of each bit period (2 H in this case). Hence, the signal produced through the output terminal $Q_A$ of the shift register 63 should originally always have the logic value "1". Accordingly, when the signal produced through the output terminal $Q_A$ of the shift register 63 has the logic level "0", the possibility that an error exists is high. In the present embodiment, the signal j is produced so that the signal j has the logic level "1" in a bit corresponding to a predetermined bit having the logic level "0" in the signal produced through the output terminal $Q_A$ of the shift register 63 and in a bit corresponding to a bit in this output signal adjacent to the predetermined bit. This signal j is supplied to the CPU 21 as the error possibility data.

The CPU 21 is supplied with the signals h and i and the latch pulse, and latches the signals h and j by the latch pulse. The data of the signals h and j immediately following the 1-byte framing code described before, are supplied to the memory circuit 22. The memory circuit 22 is provided with the pointers HH and JJ for pointing the addresses where the data of the signals h and j are stored, the pointers AA and BB for pointing the addresses where the data obtained by de-interleaving the signals h and j are stored, the pointer CC for pointing the address where each of the 4-bit decoded data $c_1$ through $c_{14}$ are stored, the pointer DD for pointing the address where each of the state data $d_1$ through $d_{14}$ is stored, the pointer NN for pointing the address where the 4-bit variable n is stored, and the pointer TT for pointing the address where a first table is stored. Each of the pointers HH, JJ, AA, and BB points the address of a memory part corresponding to fourteen bytes, and the pointer CC points the address of a memory part corresponding to seven bytes. The first table contains the priority of the decoding sequence.

Figure 11A:
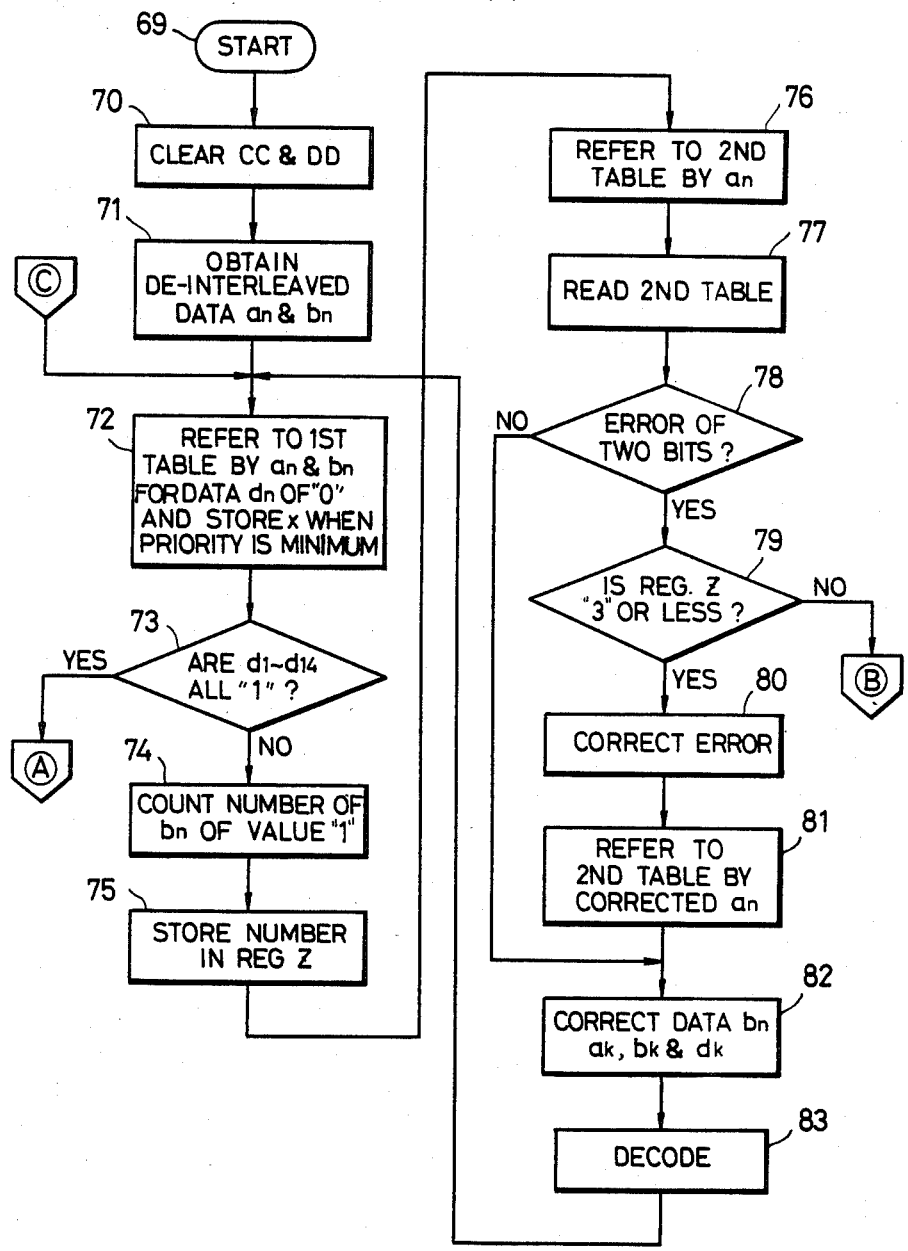
FIGS. 11A, 11B, and 11C are flow charts for explaining an operation of a central processing unit within the circuit shown in FIG. 9.
Figure 11B:
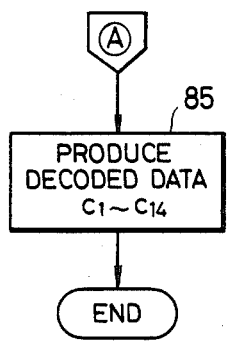
Figure 11C:
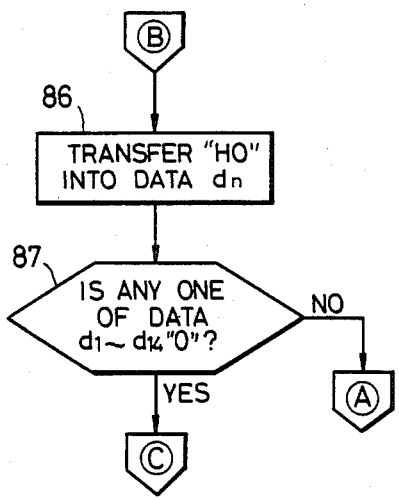

The CPU 21 performs an operation in accordance with the flow charts shown in FIGS. 11A through FIG. 11C. When the operation is started in a step 69, a step 70 clears the pointers CC and DD within the memory circuit 22. A step 71 de-interleaves the data of each of the signals h and j corresponding to fourteen bytes and obtains the encoded data $a_n$ and the error possibility data $b_n$, where n is a natural number from one to fourteen. The data of the signal h is normally interleaved in the recording system in order to reduce the probability that the error cannot be corrected due to the burst error. For this reason, the data of the signal h must be de-interleaved in the reproducing system. In this case, it is necessary to de-interleave the data of the signal j together with the data of the signal h. Accordingly, in order to perform the de-interleaving in the step 71, the CPU 21 writes the data of each of the signals h and j corresponding to fourteen bytes at the respective pointer addresses HH and JJ and then reads out the stored data from the pointer addresses HH and JJ according to such a predetermined sequence that the sequence of the data is returned to the original sequence (that is, de-interleaved). The de-interleaved data of the signals h and j are written into the respective pointer addresses AA and BB. As a result, the 8-bit encoded data $a_n$ obtained by re-arranging the data of the signal h back into the original sequence is stored at the pointer address AA for fourteen bytes, and the corresponding 8-bit error possibility data $b_n$ obtained by re-arranging the data of the signal j back into the original sequence is stored at the pointer address BB for fourteen bytes.

As described before in conjunction with FIG. 2A, each of the encoded data $a_n$ before the transmission comprises the information bits related to the original information data and the like of the control program in the upper four bits B7 through B4 thereof, the hamming code in the three bits B3 through B1 out of the lower four bits B3 through B0 thereof, and the parity bit in the least significant bit (LSB) B0 thereof. However, the encoded data $a_n$ may assume a state different from the state before the transmission shown in FIG. 2A due to a transmission loss.

A step 72 refers to the first table which contains the priority of the decoding sequence and is stored at the pointer address TT within the memory circuit 22, based on a 16-bit address constituted by the encoded data $a_n$ and the error possibility data $b_n$ when the state data $d_n$ has the value "00". Further, the value of the variable n according to which the priority in the first table is minimum, is stored at the pointer address NN within the memory circuit 22. The value "00" of the state data $d_n$ indicates that the encoded data $a_n$ and the error possibility data $b_n$ are not yet decoded and the deferment process has not been performed. When the step 72 is performed for the first time, all of the data $a_1$ through $a_{14}$ are not yet decoded, and thus, the CPU 21 first decodes the data $a_1$ and $b_1$, then decodes the data $a_2$ and $b_2$, and thereafter decodes the data $a_n$ and $b_n$ by successively varying the variable n from three to fourteen. The first table is referred to by the data $a_n$ and $b_n$ as described before, and the minimum value of the priority and a value x of the variable n for designating data $a_x$ and $b_x$ according to which the minimum value of the priority is obtained are stored at the pointer address NN, where x is a natural member from one to fourteen.

The priority of the decoding sequence is written in the first table depending on the hamming distance between the encoded data $a_n$ and the correct encoded data and the hamming distance between the error possibility data $b_n$ and the error possibility data which is obtained when no error exists, and/or depending on the variable n. The priority of the decoding sequence written in the first table is independent of the probability distribution of the generation of transmission loss in the transmission path. For example, the first table contains a priority "0" when the hamming distance is zero, a priority "1" when the hamming distance is "1", and a priority "2" when the hamming distance is "2". The first table can be obtained by replacing the underlined data in FIG. 2B by the priority "0", replacing the data without the underline by the priority "1", and replacing the symbol "*" by the priority "2", for example.

A step 73 discriminates whether or not all of the state data $d_1$ through $d_{14}$ read out from the pointer address DD have the value "11". When the discrimination result in the step 73 is YES, the operation advances to an output process shown in FIG. 11B which will be described later. On the other hand, when not all of the data $d_1$ through $d_{14}$ have the value "11" and the discrimination result in the step 73 is NO, the operation advances to a step 74. The step 74 counts the number of bits having the logic level "1" in the eight bits of the error possibility data $b_n$ which is designated by the same variable n as the state data $d_n$ having the value "00". In other words, the step 74 counts the number of bits, out of the eight bits of the encoded data $a_n$, which may be in error. A step 75 stores the number of bits of the encoded data $a_n$ which may be error into a register Z within the CPU 21. A step 76 refers to a second table by the encoded data $a_n$ read out from the pointer address AA within the memory circuit 22.

The second table constitutes an essential part of the present embodiment, and the second table is stored in a read only memory (ROM) 66. The second table contains data shown in FIG. 12, for example. In FIG. 12, the abscissa indicates the value of the upper four bits (information bits) of the encoded data $a_n$ in hexadecimal and the ordinate indicates the value of the lower four bits (hamming code and parity bit) of the encoded data $a_n$ in hexadecimal. The second table is a collection of 8-bit data referred to by the upper and lower four bits of the encoded data $a_n$. According to the second table, it is possible to know the encoded data having the shortest hamming distance with respect to an arbitrary 8-bit data, and also know the encoded data which cannot be decoded.

Figure 13:
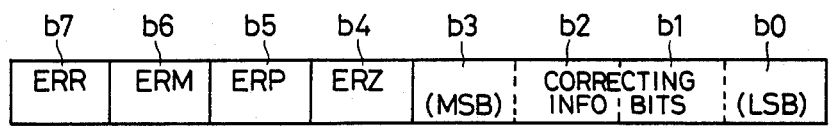
FIG. 13 shows an embodiment of the constitution of bits of data making up the table shown in FIG. 12.

The 8-bit data in the second table shown in FIG. 12 has the constitution shown in FIG. 13. In FIG. 13, lower four bits b0 through b3 represent correcting information bits and upper four bits b4 through b7 represent code bits. A code ERR which assumes a value "1" when an error check is to be performed is arranged in the most significant bit (MSB) b7. A multiple error code ERM which assumes a value "1" when errors exist in two bits of the 8-bit encoded data is arranged in the bit b6. A code ERP arranged in the bit b5 indicates that an error exists in one bit of the encoded data and the erroneous bit should originally have the value "0". Further, a code ERZ arranged in the bit b4 indicates that an error exists in one bit of the encoded data and the erroneous bit should originally have the value "1". Accordingly, when no error exists in the 8-bit encoded data with which the second table is to be referred to, the upper four bits b7 through b4 of the 8-bit data shown in FIG. 13 indicate a hexadecimal value "0" and the lower four bits b3 through b0 indicate a correct value identical to the value of the upper four bits B7 through B4 of the encoded data. On the other hand, when there is an error in one bit of the encoded data, the upper four bits of the 8-bit data shown in FIG. 13 indicate a hexadecimal value "9" or "A" and the lower four bits b3 through b0 indicate a correct value which is obtained when the one erroneous bit is corrected. That is, in this latter case, the lower four bits b3 through b0 of the 8-bit data shown in FIG. 13 indicate the decoded data.

Further, when errors exist in two bits of the encoded data, the upper four bits b7 through b4 of the 8-bit data shown in FIG. 13 indicate a hexadecimal value "C" and the lower four bits b3 through b0 indicate a hexadecimal value "E". In this case, the lower four bits b3 through b0 may indicate a hexadecimal value other than "E". However, when a special meaning is given to the hexadecimal value "E", it is possible to perform operations such as invalidating the data or requesting retransmission when the hexadecimal value "E" is obtained from the second table.

In the present embodiment, it is assumed that errors of three or more bits do not exist in the encoded data, and the bit b6 has a value "0" when three or more erroneous bits exist in the encoded data.

A step 77 reads out the 8-bit data from the second table stored in the ROM 66 based on the encoded data $a_n$ obtained in the step 76. Accordingly, when the encoded data $a_n$ has a pattern "10101011", for example, the hexadecimal value of the encoded data $a_n$ is "AB", and in this case, a hexadecimal value "0A" is read out from the second table shown in FIG. 12. Similarly, when the encoded data $a_n$ has a hexadecimal value "00", a hexadecimal value "98" is read out from the second table, and a hexadecimal value "CE" is read out from the second table when the encoded data $a_n$ has a hexadecimal value "01".

The 8-bit data read out from the second table is supplied to the CPU 21. A step 78 discriminates whether or not the bit b6 of the 8-bit data is "1", that is, whether or not two erroneous bits exist in the encoded data. When no error exists or when only one erroneous bit exists in the encoded data and the discrimination result in the step 78 is NO, the operation advances to a step 82 which will be described later. On the other hand, when the discrimination result in the step 78 is YES, a step 79 discriminates whether or not the value in the register Z within the CPU 21 is within "3". When the value in the register Z is greater than "3" and the discrimination result in the step 79 is NO, the encoded data cannot be decoded as it is, and the operation advances to a deferment process shown in FIG. 11C which will be described later. A step 80 corrects the error when the discrimination result in the step 79 is YES. The step 80 performs the error correction by performing an exclusive-OR operation between the encoded data $a_n$ and the error possibility data $b_n$ designated by the same variable n, for each of the bits. As a result, the value of those bits of the encoded data $a_n$ corresponding to bits of the error possibility data $b_n$ having the value "1" are changed. For example, when the encoded data $a_n$ has a hexadecimal value "40" and the error possibility data $b_n$ has the value "1" in the bits B3 and B0 thereof, the hexadecimal value of the encoded data $a_n$ is changed from "40" to "49". A step 81 refers to the second table again based on the encoded data which is corrected of the error. Then, the operation advances to the step 82. There is a possibility that the error is not corrected in the step 80 described before, but the probability that the bit of the error possibility data $b_n$ corresponding to the erroneous bit of the encoded data $a_n$ has the value "1" is high, and the possibility that the error is not corrected in the step 80 is extremely small.

The step 82 corrects the data $b_n$, $a_k$, $b_k$, and $k_k$, based on the encoded data $a_n$ which is obtained when the step 78 discriminates that one erroneous bit exists in the encoded data $a_n$, or based on the encoded data $a_n$ which is corrected of the error in the step 81, where $k = n + 1$ or $k = n - 1$ and in the present embodiment $k = n + 1$. For example, when the encoded data $a_n$ has a hexadecimal value "01" and the error possibility data $b_n$ has a hexadecimal value "01" in the step 79, the encoded data $a_n$ which is corrected in the step 80 has a hexadecimal value "00". When the step 81 refers to the second table based on this corrected encoded data $a_n$ having the hexadecimal value "00", a hexadecimal value "98" is read out from the second table as may be seen from FIG. 12. In the 8-bit data which has the hexadecimal value "98" and is read out from the second table, the lower four bits b3 through b0 indicate the information bits as may be seen from FIG. 13. Hence, the value of the upper four bits B7 through B4 of the encoded data $a_n$ having the constitution shown in FIG. 2A is changed to a hexadecimal value "8" which is the value of the lower four bits of the 8-bit data read out from the second table. As a result, the hexadecimal value of the encoded data $a_n$ is changed to "80". The step 82 corrects the error possibility data $b_n$ based on the encoded data $a_n$ having the hexadecimal value which is changed to "80" in the step 81. For example, when the error possibility data $b_n$ has a hexadecimal value "01" in the above case, the MSB of the error possibility data $b_n$ is corrected to "1" because the hexadecimal value of the encoded data $a_n$ is changed to "80" in the above case. In other words, the error possibility data $b_n$ is corrected to a hexadecimal value "81". The hexadecimal value of the error possibility data $b_n$ is corrected similarly in other cases, based on the changed hexadecimal value of the encoded data $a_n$.

The step 82 also corrects correctable parts of the data $a_k$ and $b_k$ which are adjacent to the data $a_n$ and $b_n$, respectively. The error possibility data $b_n$ is generated by de-interleaving the signal j described before, and the signal j has the logic value "1" in a predetermined bit thereof corresponding to a bit of the demodulated signal h whereat the possibility that an error exists is high and in a bit immediately subsequent to the predetermined bit. As a result, each of the error possibility data $b_n$ and $b_k$ has the logic value "1" in predetermined one bit thereof. For example, in the case where the hexadecimal value of the error possibility data $b_n$ is corrected from "01" to "81" as described before, the MSB of the adjacent error possibility data $b_k$ is also corrected to "1". This predetermined one bit of the error possibility data $b_k$ is the correctable part of the error possibility data $b_k$. Hence, when the error possibility data $b_k$ is corrected in accordance with the correction of the error possibility data $b_n$, the correctable part of the corresponding encoded data $a_k$ is corrected. When the adjacent data $a_k$ and $b_k$ are corrected, the 2-bit state data $d_k$ is read out from the pointer address DD within the memory circuit 22. When the state data $d_k$ read out from the pointer address DD has a value "H0" indicating deferment of the decoding, only this state data $d_k$ is cleared to "00". Actually, the state data has a value "10" or "01" when the decoding is to be deferred, but the value of the state data is indicated as "H0" for convenience's sake. The state data $d_k$ is cleared to "00" because even when the value of the state data $d_k$ is "H0" indicating that the data $a_k$ and $b_k$ before the correction is performed cannot be decoded, the data $a_k$ and $b_k$ may become decodeable after the correction described before is performed.

When the step 78 discriminates that an error exists in one bit of the encoded data (that is, when the bits b7 through b4 indicate a hexidecimal value "A" or "9" in FIG. 13) and the discrimination result is NO, the operation advances to the step 82 as described before. The step 82 compares the corrected encoded data $a_n'$ having the upper four bits thereof corrected to the value indicated by the lower four bits b3 through b0 of the 8-bit data read out from the second table in the step 77, with the encoded data $a_n$ before the correction is made. Further, the value of the bit of the error possibility data $b_n$ corresponding to a certain bit of the corrected encoded data $a_n'$, the value of which certain bit has been corrected from the value of the corresponding bit of the encoded data $a_n$, is corrected to "1" where necessary. Moreover, the value of the bit of the error possibility data $b_n$ corresponding to a specific bit of the corrected encoded data $a_n'$, the value of which specific bit has not been corrected from the value of the corresponding bit of the encoded data $a_n$, is corrected to "0" where necessary. In addition, the error possibility data $b_k$ and the like are also corrected in accordance with the correction of the error possibility data $b_n$.

For example, in the case where the encoded data $a_n$ has a hexadecimal value "00" and the error possibility data $b_n$ has a hexadecimal value "01" in the step 76, a hexadecimal value "98" is obtained from the second table shown in FIG. 12 when the second table is referred to by the encoded data $a_n$ in the step 77. Hence, in this case, the corrected encoded data $a_n'$ has a hexadecimal value "80". When the step 82 compares the hexadecimal values "00" and "80" of the encoded data $a_n$ and the corrected encoded data $a_n'$, respectively, it is seen that only the MSB of the encoded data has been changed to "1". Thus, the MSB of the error possibility data $b_n$ is corrected to "1", and the LSB of the error possibility data $b_n$ is corrected to "0". Further, in the case where the step 78 discriminates that no erroneous bit exists in the encoded data and the discrimination result is NO (that is, when the bits b7 through b4 shown in FIG. 13 indicate a hexadecimal value "0"), the step 82 corrects the value of the bit of the error possibility data $b_n$ having a value "1" to a value "0".

Therefore, the step 82 performs the correction of the data $b_n$, $a_k$, $b_k$, and $d_k$ according to the needs, and the corrected and/or unchanged data are stored at the respective pointer addresses BB, AA, and DD. In addition, the encoded data $a_n$ is stored at the pointer address AA. Thereafter, a step 83 stores at the pointer address CC within the memory circuit 22 the upper four bits of the encoded data $a_n$ which is obtained by referring to the second table for a maximum of two times, as the decoded data $c_n$. Moreover, the value of the state data $d_n$ is set to "11" to indicate that the encoded data $a_n$ has been decoded, and this value of the state data $d_n$ is stored at the pointer address DD.

When the step 72 is performed for the second time and onwards, the variable n is varied and the first table is referred to based on the data $a_n$ and $b_n$, where the variable n has such a value that the state data $d_n$ has a value "00" indicating that the encoded data has not yet been decoded or that the decoding of the encoded data is deferred. The value x of the variable n with which the priority becomes a minimum, is stored at the pointer address NN.

In the case where the value in the register Z is greater than "3" in the step 78, the operation advances to a step 86 shown in FIG. 11C. The step 86 transfers a value "H0" indicating deferment of the decoding into the state data $d_n$ designated by the variable n. A step 87 discriminates whether or not any of the state data $d_1$ through $d_{14}$ has the value "00". When there is a state data having the value "00" (that is, when the corresponding encoded data $a_n$ has not yet been decoded) and the discrimination result in the step 87 is YES, the operation advances to the step 72 shown in FIG. 11A. On the other hand, when all of the state data $d_1$ through $d_{14}$ either has the value "11" or "H0" (that is, when all of the encoded data are either already decoded or the decoding thereof is deferred) and the discrimination result in the step 87 is NO, the operation advances to the output process shown in FIG. 11B.

By performing the step 72 through 83 a plurality of times, the data $a_n$ and $b_n$ having the priority "0" are first decoded and the corresponding decoded data $c_n$ are successively obtained. Thereafter, the data $a_n$ and $b_n$ are corrected and decoded in the sequence of data having the shorter hamming distance. The correctable part of the data $a_n$ and $b_n$ is corrected and the priority of the data $a_n$ and $b_n$ is reduced. For example, even the data $a_n$ and $b_n$ which are discriminated in the step 78 as not being decodeable are corrected when the adjacent data $a_k$ and $b_k$ are corrected, and the data $a_n$ and $b_n$ become decodeable. In this case, the data $a_n$ and $b_n$ are decoded the next time the steps 72 through 83 are performed.

When the processing operations described heretofore are repeated and the value of all of the state data $d_1$ through $d_{14}$ becomes "11" or when none of the state data $d_1$ through $d_{14}$ has the value "00" in the step 87, the CPU 21 performs the output process shown in FIG. 11B. The step 75 successively reads out each of the 4-bit decoded data $c_1$ through $c_{14}$ from the pointer address CC within the memory circuit 22, and produces the decoded data $c_1$ through $c_{14}$ in parallel through the output terminals 23a through 23d shown in FIG. 9.

In the present embodiment, the signals h and j are generated by use of a digital circuit. However, it is possible to generate the signals h and j within the CPU 21 as in the case of the first embodiment described before.

The present invention is not limited to the embodiments described heretofore, and it is possible to correct errors in three or more bits of the encoded data by use of the digital signal decoding system according to the present invention. For example, when the digital signal decoding system according to the present invention is applied to a case where a correction of up to three erroneous bits in the encoded data is to be performed, additional steps are inserted between the step 77 and 78 shown in FIG. 11A. In this case, the additional steps include a first step for discriminating the existence of one erroneous bit, a second step for discriminating which bit or bits of the signal stored in the register Z have the value "1" when the discrimination result in the first step is YES, and the like, for example.

An example of the correction of up to three erroneous bits of the encoded data will now be briefly described. It will be assumed that an encoded data has a pattern "00000000" and the probability that the encoded data actually has one of the following patterns (i) through (viii) is high.

| | |
|---|---|
| (i) | "00001110" |
| (ii) | "00010011" |
| (iii) | "00100101" |
| (iv) | "00111000" |
| (v) | "01001001" |
| (vi) | "01010100" |
| (vii) | "01100010" |
| (viii) | "10000000" |

Among the patterns (i) through (viii), the patterns (i) through (vii) correspond to cases where three erroneous bits exist in the encoded data "00000000". The pattern (viii) corresponds to a case where one erroneous bit exists in the encoded data "00000000".

In the case where an error possibility data in correspondence with the encoded data "00000000" has a pattern "1???????", where the symbol "?" indicates that the bit may either have the value "1" or "0", it is assumed that the correct pattern of the encoded data is the pattern (viii). On the other hand, in the case where the error possibility data in correspondence with the encoded data "00000000" has a pattern "0???????", an exclusive-OR operation is performed between the encoded data and the error possibility data for each bit, and it is assumed that one of the patterns (i) through (vii) having the shortest hamming distance with respect to the pattern which is obtained as a result of the exclusive-OR operation is the correct pattern of the encoded data. For example, in the case where the error possibility data has a pattern "00001100", a pattern "00001100" is obtained as a result of the exclusive-OR operation performed between the encoded data "00000000" and the error possibility data for each bit. In this case, the pattern (i) out of the patterns (i) through (vii) has the shortest hamming distance with respect to the pattern "00001100" which is obtained as a result of the exclusive-OR operation, and it is assumed that the correct pattern of the encoded data is the pattern (i).

The digital signal decoding system according to the present invention can be applied similarly to cases where a correction of four or more erroneous bits in the encoded data is to be performed, by appropriately modifying the flow chart shown in FIG. 11A. Further, the digital signal decoding system according to the present invention is applicable to any digital signal which is encoded so that it is possible to correct an arbitrary number of erroneous bits in one code word of the digital signal.

Figure 14:
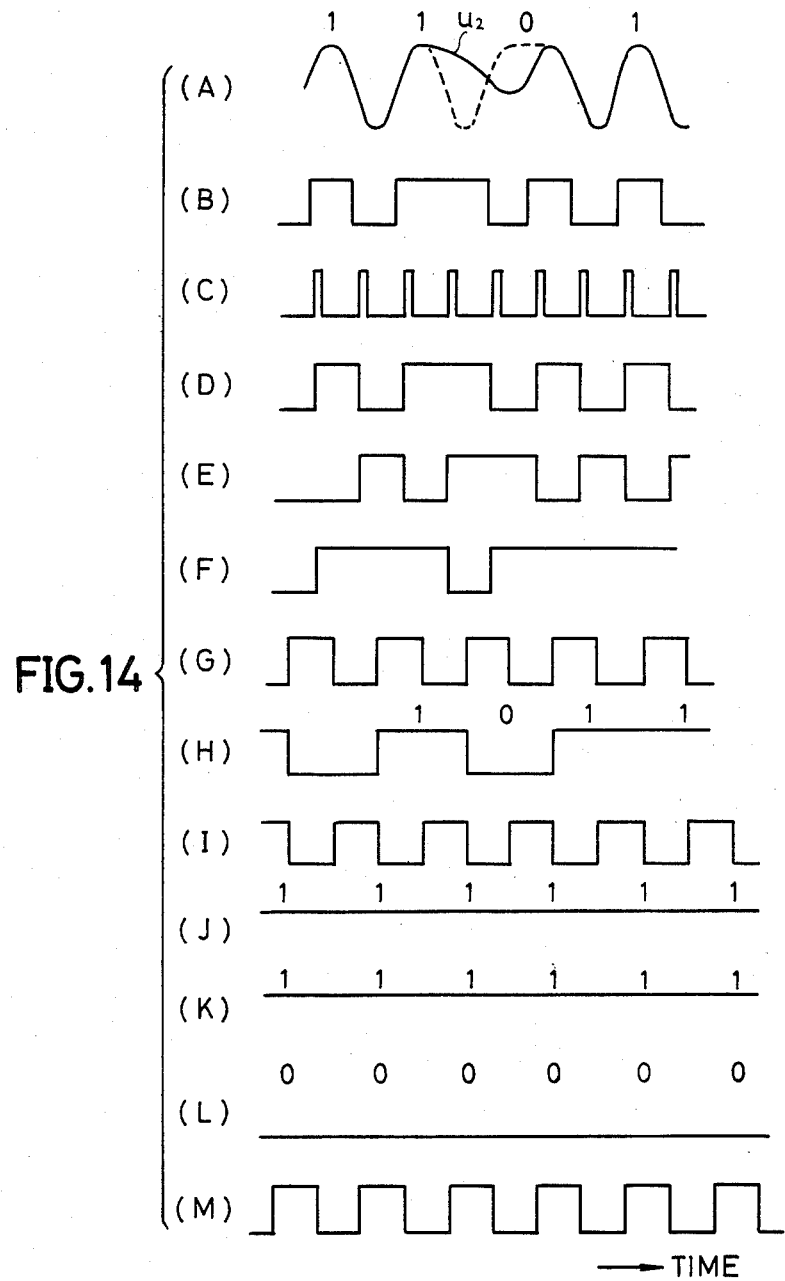
FIGS. 14(A) through 14(M) show signal waveforms at parts of the circuit shown in FIG. 9 when a predetermined distortion occurs in a reproduced signal.

Next, a case will be considered where a reproduced signal shown in FIG. 14(A) is applied to the input terminal 11 shown in FIG. 9 and a biphase space modulated digital signal shown in FIG. 14(B) is produced from the comparator 12. In this case, a signal part indicated by a solid line $u_2$ represents a part where the signal waveform is distorted although the signal waveform should originally be as indicated by a phantom line. In this case, the signal waveforms at parts of the circuit shown in FIG. 9 become as shown in FIGS. 14(C) through 14(M). The signal waveforms shown in FIGS. 14(C) and 14(M) correspond to the waveforms of the signals shown in FIGS. 10(C) through 10(M), respectively.

In this case, although the bits of the encoded data shown in FIG. 14(H) should originally have a pattern "1101", the bits of the encoded data have a pattern "1011", and errors exists in two bits of the encoded data. However, the bits of the error possibility data shown in FIG. 14(L) have a pattern "0000", and even the bits of the error possibility data corresponding to the erroneous bits of the encoded data have the value "0". In other words, although errors exists in the bits of the encoded data in this case, the error possibility data does not indicate the errors. Hence, when the distortion shown in FIG. 14(A) is introduced in the reproduced signal which is applied to the input terminal 11, there is a problem in that the error possibility data may not always accurately indicate the possibility of error in the encoded data.

Accordingly, a description will now be given with respect to an embodiment of an error possibility data generating circuit for generating an error possibility data which always accurately indicates the possibility of error in the encoded data even when the reproduced signal includes the kind of distortion described before.

Figure 15:
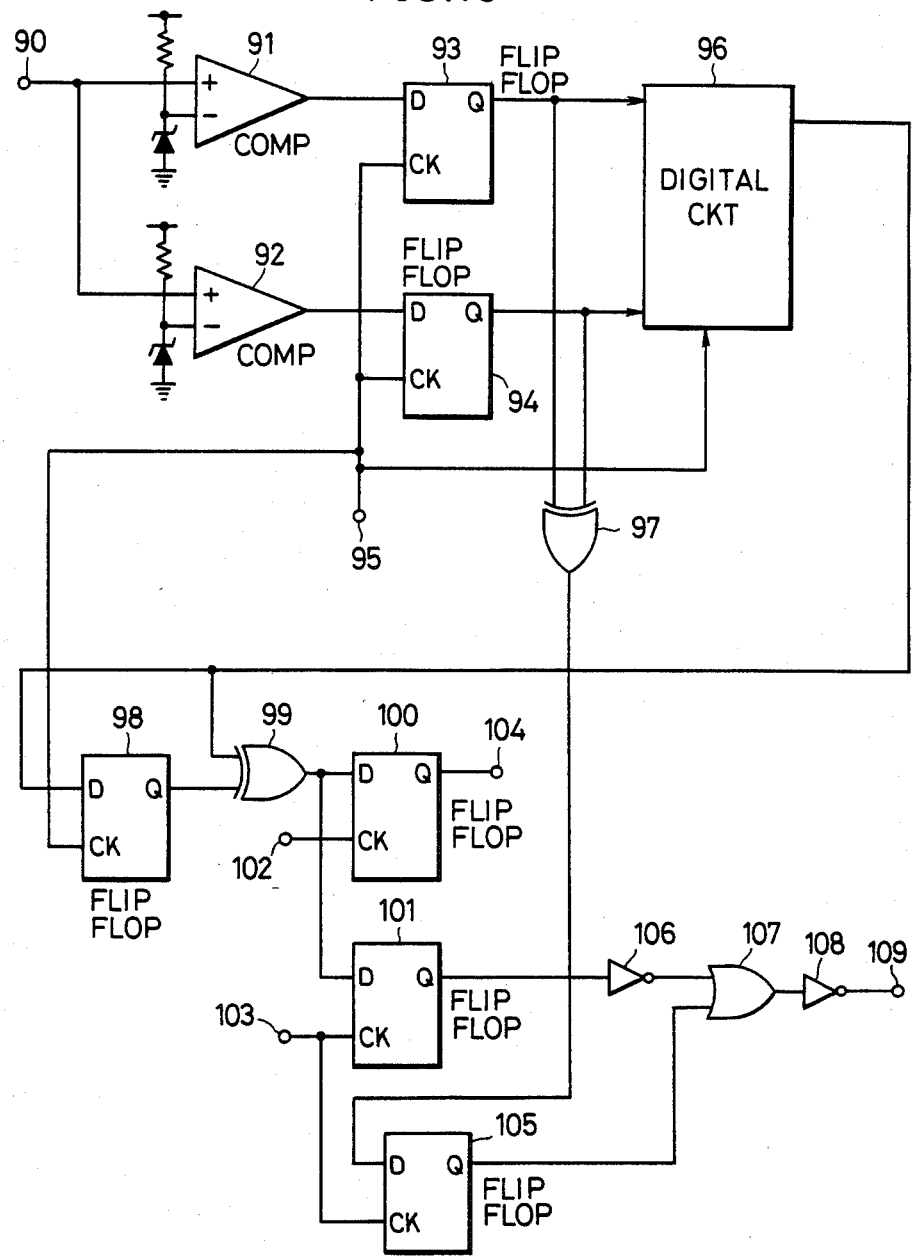
FIG. 15 is a circuit diagram showing an embodiment of an error possibility data generating circuit.

FIG. 15 is a circuit diagram showing an embodiment of an error possibility data generating circuit. In FIG. 15, a biphase space modulated reproduced signal aa shown in FIG. 16(A) which is obtained through a transmission path such as a recording medium, is applied to an input terminal 90. The signal aa is obtained by biphase space modulating an encoded data having bits $aa_1$ through $aa_4$ of a pattern "1101". Although a part of the signal waveform corresponding to the bits $aa_2$ and $aa_3$ should originally be as indicated by a phantom line in FIG. 16(A), this part of the signal waveform is distorted as indicated by a solid line due to transmission error and the like. The signal aa applied to the input terminal 90 is supplied to comparators 91 and 92. When a peak-to-peak value of the signal aa is represented by $\alpha$, the comparator 91 has a threshold value $2\alpha/3$ as indicated by a one-dot chain line Ia in FIG. 16(A), for example. Hence the comparator 91 compares the signal aa with the threshold value $2\alpha/3$ and produces a signal bb shown in FIG. 16(B), which signal bb is supplied to a data input terminal of a D-type flip-flop 93. On the other hand, the comparator 92 has a threshold value $\alpha/3$ as indicated by a two-dot chain line IIa in FIG. 16(A), for example. The comparator 92 compares the signal aa with the threshold value $\alpha/3$ and produces a signal cc shown in FIG. 16(C), which signal cc is supplied to a data input terminal of a D-type flip-flop 94. A sampling pulse (reproduced horizontal synchronizing signal) dd shown in FIG. 16(D) is applied to an input terminal 95 and is supplied to respective clock input terminals of the flip-flops 93 and 94.

The flip-flop 93 latches the signal bb by the sampling pulse dd and produces a signal ee shown in FIG. 16(E) through a Q-output terminal thereof. The signal ee is supplied to a digital circuit 96 and an exclusive-OR circuit 97. This signal ee is obtained by quantizing the signal aa by the threshold value of the comparator 91. On the other hand, the flip-flop 94 latches the signal cc by the sampling pulse dd and produces a signal ff shown in FIG. 16(F) through a Q-output terminal thereof. The signal ff is supplied to the digital circuit 96 and the exclusive-OR circuit 97. This signal ff is obtained by quantizing the signal aa by the threshold value of the comparator 92.

For example, the digital circuit 96 obtains a logical sum of the signals ee and ff and produces a signal gg shown in FIG. 16(G). A circuit which obtains a plurality of values (for example, bits $ee_1$, $ee_2$, $ee_3$ $ff_1$, $ff_2$, and $ff_3$) related to the past and present of the signals ee and ff by delaying the signals ee and ff by the sampling pulse dd and generates the signal gg (for example, a bit $g_1$) by performing a logical operation with the plurality of values, a circuit which simply generates the signal ee as the signal gg, a circuit which uses the sampling pulse dd and the like may be used for the digital circuit 96. The signal gg is generated in an optimum state with respect to the probability distribution of the generation of transmission loss in the transmission path such as the recording system and the reproducing system. The output signal gg of the digital circuit 96 is supplied to a data input terminal of a D-type flip-flop 98 and an exclusive-OR circuit 99.

The flip-flop 98 latches the signal gg by the sampling pulse dd to perform a delay of one period of the sampling pulse dd. The output signal of the flip-flop 98 is supplied to the exclusive-OR circuit 99. The exclusive-OR circuit 99 performs an exclusive-OR operation between the signal gg and the signal gg which is delayed by one period of the sampling pulse dd, and produces a signal hh shown in FIG. 16(H). The signal hh is supplied to respective data input terminals of D-type flip-flops 100 and 101. The flip-flop 100 latches the signal hh by use of a data bit extracting clock pulse ii shown in FIG. 16(I) which is obtained from an input terminal 102, and produces an encoded data jj shown in FIG. 16(J) through an output terminal 104. On the other hand, the flip-flop 101 latches the signal hh by use of a clock bit extracting clock pulse kk shown in FIG. 16(K) which is obtained from an input terminal 103, and produces a clock bit ll shown in FIG. 16(L).

The exclusive-OR circuit 97 performs an exclusive-OR operation between the signals ee and ff and produces a signal mm shown in FIG. 16(M). When the part of the waveform corresponding to the bits $aa_2$ and $aa_3$ of the signal aa shown in FIG. 16(A) has no error as indicated by the phantom line, the waveforms of the signals ee and ff become the same and the signal mm assumes a low level. However, when the signal aa is distorted as indicated by the solid line in FIG. 16(A), the signal mm assumes a high level as shown in FIG. 16(M) when the waveforms of the signals ee and ff differ. In other words, the signal mm can be used as a data for detecting abnormality in the waveform of the signal aa. The signal mm is supplied to a data input terminal of a D-type flip-flop 105.

The flip-flop 105 latches the signal mm by the clock pulse kk which is obtained from the input terminal 103 and produces a signal nn shown in FIG. 16(N). The signal ll produced from the flip-flop 101 is inverted in an inverter 16 and is supplied to an OR circuit 107. The signal nn from the flip-flop 105 is also supplied to the OR circuit 107. An output signal of the OR circuit 107 is inverted in an inverter 108. The inverter 108 produces an error possibility data oo shown in FIG. 16(O) and this data oo is obtained through an output terminal 109.

Figure 16:
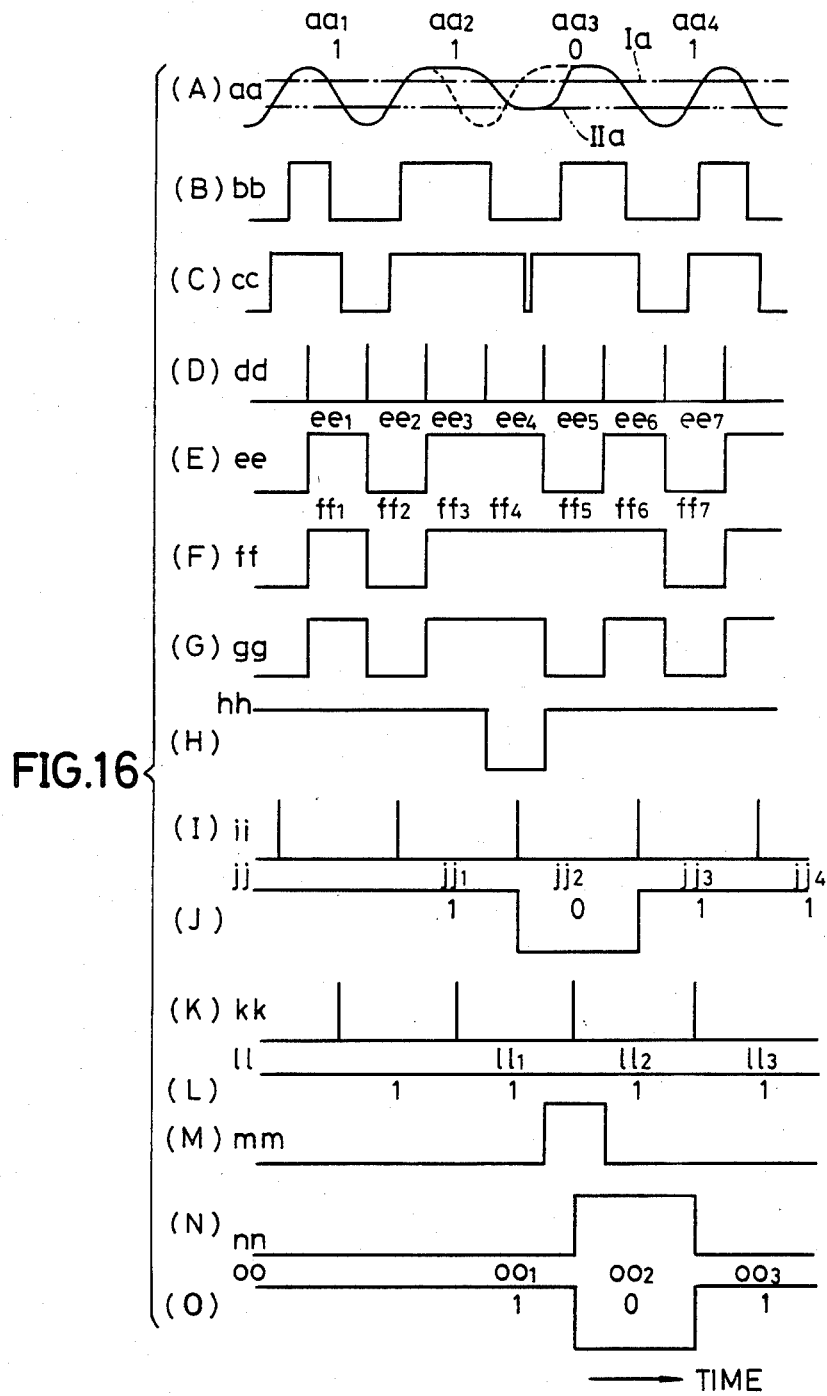
FIGS. 16(A) through 16(O) show signal waveforms at parts of the circuit shown in FIG. 15.

In FIG. 16, when it is assumed that there is no distortion in the signal aa, the bits $aa_1$ through $aa_4$ of the signal aa has a pattern "1101". However, when the part of the waveform corresponding to the bits $aa_2$ and $aa_3$ of the signal aa is distorted, bits $jj_1$ through $jj_4$ of the encoded data jj which is generated has a pattern "1011" and the bits $jj_2$ and $jj_3$ are inverted. Further, a bit $oo_2$ of the error possibility data oo having half period of the bit $jj_2$ and a half period of the bit $jj_3$ overlapping with the bit $oo_2$, has a value "0". For this reason, it is possible to discriminate the error in the bits $jj_2$ and $jj_3$ of the encoded data jj.

Figure 17:
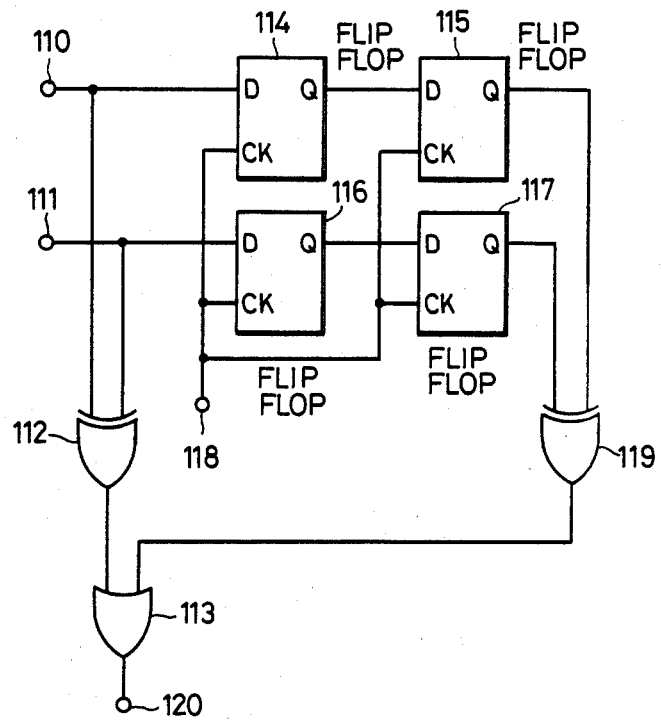
FIG. 17 is a circuit diagram showing an embodiment of a part of the circuit shown in FIG. 15.
Figure 18:
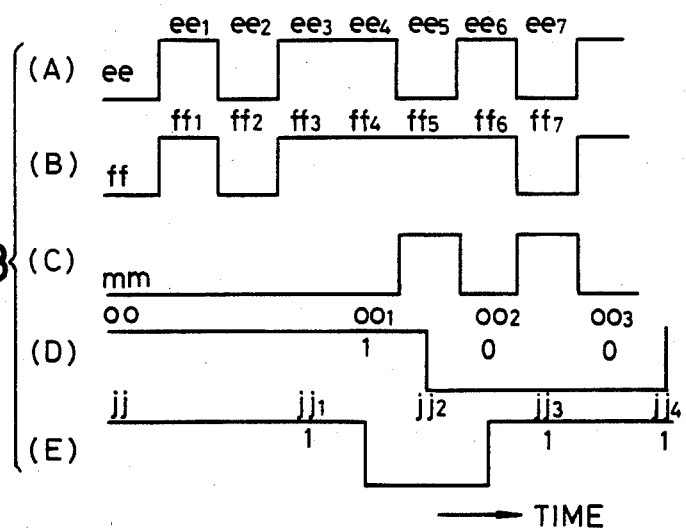
FIGS. 18(A) through 18(C) show signal waveforms at parts of the circuit shown in FIG. 17, and FIGS. 18(D) and (E) show signal waveforms of output signals of the circuit shown in FIG. 15 when the circuit shown in FIG. 17 is used in the circuit shown in FIG. 15.

For example, a circuit shown in FIG. 17 may be used instead of the exclusive-OR circuit 97 shown in FIG. 15. In FIG. 17, signals ee and ff shown in FIGS. 18(A) and 18(B) are applied to input terminals 110 and 111, respectively. An exclusive-OR circuit 112 performs an exclusive-OR operation between the signals ee and ff, and an output signal of the exclusive-OR circuit 112 is supplied to an OR circuit 113. The sampling pulse dd from an input terminal 118 is supplied to respective clock input terminals of D-type flip-flops 114 through 117. The signal ee is delayed by two periods of the sampling pulse dd by the flip-flops 114 and 115, and an outpu signal of the flip-flop 115 is supplied to an exclusive-OR circuit 119. On the other hand, the signal ff is delayed by two periods of the sampling pulse dd by the flip-flops 116 and 117, and an output signal of the flip-flop 117 is supplied to the exclusive-OR circuit 119. The exclusive-OR circuit 119 performs an exclusive-OR operation between the delayed signals ee and ff, and an output signal of the exclusive-OR circuit 119 is supplied to the OR circuit 113.

Accordingly, the OR circuit 113 produces a signal mm shown in FIG. 18(C), and this signal mm is obtained through an output terminal 120. The signal mm is supplied to the data input terminal of the flip-flop 105 shown in FIG. 15. As a result, an error possibility data oo shown in FIG. 18(D) is obtained through the output terminal 109 shown in FIG. 15 in this case. Further, an encoded data jj shown in FIG. 18(E) is obtained through the output terminal 104 shown in FIG. 15 in this case. When the encoded data jj is latched by the clock pulse kk obtained through the input terminal 103, the phase of the bits $jj_1$ through $jj_3$ of the encoded data jj and the phase of the bits $oo_1$ through $oo_1$ through $oo_3$ of the error possibility data oo match with each other. Since the bits $oo_2$ and $oo_3$ of the error possibility data oo are "0", it can be discriminated that errors exist in the bits $jj_2$ and $jj_3$ of the encoded data jj.

In addition, instead of using the circuit shown in FIG. 17, it is possible to supply the error possibility data oo produced through the output terminal 109 to a monostable multivibrator, for example. In this case, the low-level period of the error possibility data oo is widened by a time period in the range of two periods of the clock pulse kk.

Moreover, in the circuit shown in FIG. 15, a signal indicating an abnormality in the waveform is obtained from the exclusive-OR circuit 97 even when an NRZ modulated digital signal is applied to the input terminal 90. Hence, in this case, the output signal of the exclusive-OR circuit 97 can be inverted and used as an error possibility data which is in correspondence with the NRZ modulated digital signal. Thus, the present embodiment of the error possibility data generating circuit can also generate an error possibility data with respect to a digital signal other than a signal obtained by a self clock modulation.

Figure 4:
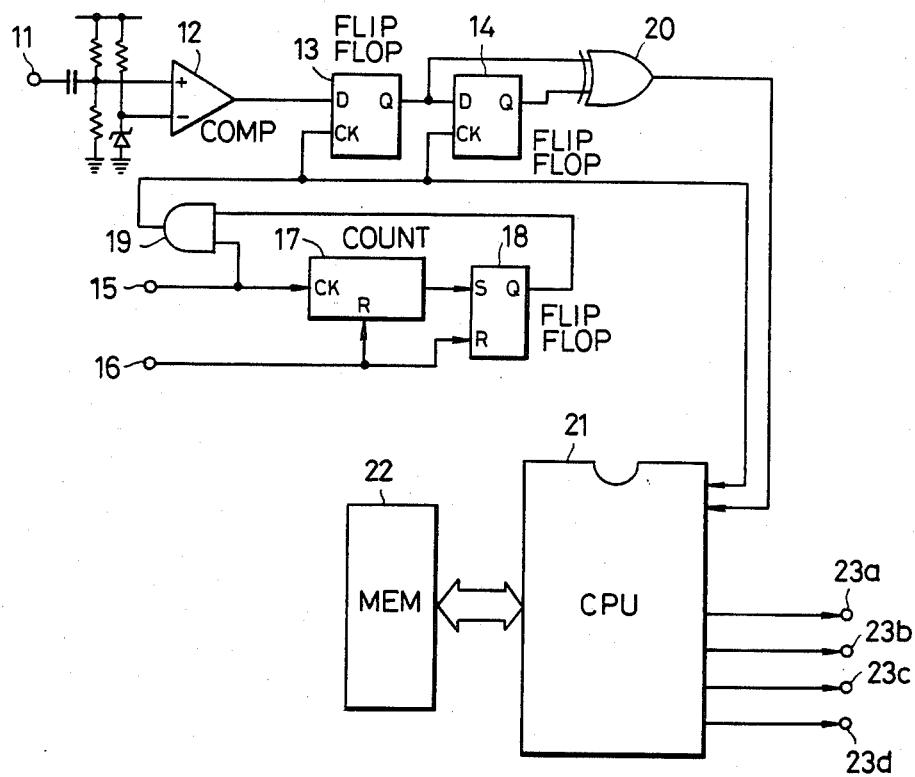
FIG. 4 is a circuit diagram showing a first embodiment of the digital signal decoding system according to the present invention.

In the embodiments described heretofore, the data applied to the input terminal 11 shown in FIGS. 4 and 9 is a signal reproduced from a recording medium (disc). However, the data applied to the input terminal 11 may be obtained through any suitable transmission path other than the recording medium.

Further, the present invention is not limited to these embodiments, but various variations and modifications may be made without departing from the scope of the present invention.

What is claimed is:

1. A digital signal decoding system comprising:
   input terminal means for receiving a digital signal comprising a plurality of code words through a transmission path, said digital signal being encoded so that each code word is constituted by adding a Hamming correction code to information bits and being modulated according to a self clock modulation system;
   demodulating means for obtaining a demodulated signal by demodulating the digital signal from said input terminal means;
   first means for generating a demodulated data and a clock signal from the output demodulated signal of said demodulating means, said demodulated data comprising a predetermined number of demodulated code words;
   error possibility data generating means for generating error possibility data from said demodulated data and said clock signal which are supplied by said first means, said error possibility data comprising a plurality of error possibility data words in correspondence with said predetermined number of demodulated code words and assuming a first logic value at a bit position corresponding to a bit of said demodulated data whereat an error does not exist and assuming a second logic value at a bit position corresponding to a bit of said demodulated data whereat the possibility that an error exists is high;
   second means for sequentially correcting error in said predetermined number of demodulated code words and said plurality of error possibility data words, and decoding corrected demodulated code words and corrected error possibility data words to produce a decoded data; and
   first memory means coupled to said second means for pre-storing a first table containing a priority of a decoding sequence, said priority of the decoding sequence being the priority with which said predetermined number of demodulated code words are to be corrected and decoded by said second means and being determined by values of a demodulated data word and an error possibility data word,
   said second means obtaining the priority of the decoding sequence of each demodulated code word from said first table based on each demodulated code word and each corresponding error possibility data word and performing correction and decoding with respect to said predetermined number of demodulated code words and the corresponding error possibility data words in a sequence depending on the priority of the decoding sequences of each demodulated code word, so as to correct error in one or a plurality of bits of each demodulated code word and each corresponding error possibility data word.

2. A digital signal decoding system as claimed in claim 1 in which the priority of the decoding sequence contained in said first table is determined based on a probability distribution of the generation of transmission loss in the transmission path.

3. A digital signal decoding system as claimed in claim 1 in which said first means, said error possibility data generating means, and said second means are constituted by a single central processing unit, said first memory means comprising a memory circuit coupled to said central processing unit.

4. A digital signal decoding system as claimed in claim 1 in which when said second means corrects error in one or a plurality of bits of one demodulated code word, said second means also corrects error in one or a plurality of bits of an adjacent demodulated code word which is adjacent to said one demodulated code word and an error possibility data word which is in correspondence with said adjacent demodulated code word.

5. A digital signal decoding system as claimed in claim 1 in which said demodulating means comprises a comparator for comparing the level of said digital signal with a reference level.

6. A digital signal decoding system as claimed in claim 1 which further comprises second memory means coupled to said second means, for pre-storing a second table containing the hamming distances of the demodulated code words with respect to respective certain code words, said second means correcting error in one or a plurality of bits in each demodulated code word and each corresponding error possibility data word based on the priority of the decoding sequence obtained from said first table and the hamming distance which is obtained by referring to said second table based on upper and lower bits of said each demodulated code word.

7. A digital signal decoding system as claimed in claim 6 in which the priority of the decoding sequence contained in said first table is determined independent of a probability distribution of the generation of transmission loss in the transmission path.

8. A digital signal decoding system as claimed in claim 6 in which said second means refers to said second table for a maximum of two times.

9. A digital signal decoding system as claimed in claim 6 in which when said second means corrects error in one or a plurality of bits of one demodulated code word, said second means also corrects error in one or a plurality of bits of an adjacent demodulated code word which is adjacent to said one demodulated code word and an error possibility data word which is in correspondence with said adjacent demodulated code word.

10. A digital signal decoding system as claimed in claim 6 in which each data of the hamming distance contained in said second table comprises a code part constituting upper bits of the data and a correct information part constituting lower bits of the data.

11. A digital signal decoding system as claimed in claim 10 in which said code part indicates a first value when the demodulated code word used to refer to said second table has no error, indicates a second value when said demodulated code word has an error in one bit thereof, and indicates a third value when said demodulated code word has errors in two bits thereof, and said correct information part indicates a value identical to upper bits of the demodulated code word used to refer to said second table when said demodulated code word has no error, indicates a correct value obtained by correcting an error in one bit thereof when said demodulated code word has the error in one bit thereof, and indicates a fourth value when said demodulated code word has errors in two bits thereof.

12. A digital signal decoding system as claimed in claim 6 in which said demodulating means, said first means, and said error possibility data generating means are constituted by a digital circuit which is applied with said digital signal and first and second synchronizing signals.

13. A digital signal decoding system as claimed in claim 6 in which said demodulating means comprises a first comparator for comparing the level of said digital signal with a first reference level and a second comparator for comparing the level of said digital signal with a second reference level, said first and second reference levels being mutually different levels which are smaller than a peak-to-peak level of said digital signal.

* * * * *